(12) United States Patent
Lee et al.

(10) Patent No.: US 11,925,129 B2
(45) Date of Patent: Mar. 5, 2024

(54) MULTI-LAYER SELECTOR DEVICE AND METHOD OF FABRICATING THE SAME

(71) Applicant: POSTECH RESEARCH AND BUSINESS DEVELOPMENT FOUNDATION, Pohang-si (KR)

(72) Inventors: Jang Sik Lee, Pohang-si (KR); Kwang Hyun Kim, Seoul (KR); Young Jun Park, Hwaseong-si (KR)

(73) Assignee: POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 169 days.

(21) Appl. No.: 17/623,241

(22) PCT Filed: Nov. 9, 2021

(86) PCT No.: PCT/KR2021/016197
§ 371 (c)(1),
(2) Date: Dec. 27, 2021

(87) PCT Pub. No.: WO2022/103110
PCT Pub. Date: May 19, 2022

(65) Prior Publication Data
US 2022/0367809 A1    Nov. 17, 2022

(30) Foreign Application Priority Data
Nov. 12, 2020   (KR) .......................... 10-2020-0151131
Nov. 12, 2020   (KR) .......................... 10-2020-0151132

(51) Int. Cl.
*H10N 70/00*   (2023.01)
*H10B 63/00*   (2023.01)

(52) U.S. Cl.
CPC ......... *H10N 70/8833* (2023.02); *H10B 63/80* (2023.02); *H10N 70/023* (2023.02);
(Continued)

(58) Field of Classification Search
CPC ............. H10N 70/826; H10N 70/8833; H10N 70/245; H10N 70/841; H10N 70/011;
(Continued)

(56) References Cited

U.S. PATENT DOCUMENTS 8,614,135 B2   12/2013   Eun et al.
9,960,350 B2    5/2018   Ha
(Continued)

FOREIGN PATENT DOCUMENTS

JP   2013-138265   7/2013
JP   2017-195399   10/2017
(Continued)

*Primary Examiner* — Thong Q Le
(74) *Attorney, Agent, or Firm* — Morgan, Lewis & Bockius LLP

(57) ABSTRACT

The present invention provides a multi-layer selector device exhibiting a low leakage current by controlling a threshold voltage. According to an embodiment of the present invention, the multi-layer selector device comprises: a substrate; a lower electrode layer disposed on the substrate; an insulating layer disposed on the lower electrode layer and having a via hole passing through to expose the lower electrode layer; a switching layer disposed on the lower electrode layer in the via hole, performing a switching operation by forming and destroying a conductive filament, and made of a multi-layer to control the formation of the conductive filament; and an upper electrode layer disposed on the switching layer.

19 Claims, 19 Drawing Sheets

(52) U.S. Cl.
CPC ......... *H10N 70/041* (2023.02); *H10N 70/063* (2023.02); *H10N 70/841* (2023.02)

(58) Field of Classification Search
CPC ...... H10N 70/20; H10N 70/021; H10N 70/24; H10N 70/882; H10N 70/883; H10N 70/063; H10N 70/801; H10N 70/823; H10N 70/8416; H10N 80/01; H10N 89/00; H10N 70/231; H10N 70/884; H10N 50/10; H10N 70/821; H10N 70/8616; H10N 70/881; H10N 70/8845; H10N 70/026; H10N 70/028; H10N 70/041; H10N 70/043; H10N 70/046; H10N 70/066; H10N 70/235; H10N 70/8822; H10N 70/8825; H10N 70/8828; H10N 70/8836; G11C 13/003; G11C 13/0007; G11C 2213/76; G11C 5/025; G11C 13/0002; G11C 2213/71; G11C 5/06; G11C 11/1659; G11C 13/0004; G11C 13/0023; G11C 5/063; G11C 7/18; G11C 13/004; G11C 13/0069; G11C 13/0011; G11C 13/0021; G11C 13/0097; G11C 17/16; G11C 2013/0073; G11C 2013/0078; G11C 2213/15; G11C 2213/32; G11C 2213/35; G11C 2213/51; G11C 2213/54; G11C 2213/55; G11C 2213/56; G11C 2213/72; G11C 2213/74; G11C 2213/77; G11C 2213/79; G11C 5/04; H10B 63/20; H10B 63/80; H10B 63/845; H10B 99/00; H10B 63/30; H10B 63/34; H10B 61/00; H10B 61/10; H10B 63/24; H10B 63/82; H10B 63/84; H10B 63/22; H01L 21/76877; H01L 27/105; H01L 27/101

See application file for complete search history.

(56) References Cited

U.S. PATENT DOCUMENTS

| | | | |
|---|---|---|---|
| 10,103,329 | B2 | 10/2018 | Banno et al. |
| 10,109,792 | B2 | 10/2018 | Lee |
| 10,522,754 | B2 * | 12/2019 | Narayanan ........... H10N 70/826 |
| 2017/0213958 | A1 | 7/2017 | Kim et al. |
| 2019/0221739 | A1 | 7/2019 | Kim |

FOREIGN PATENT DOCUMENTS

| | | |
|---|---|---|
| KR | 2010-0090969 | 8/2010 |
| KR | 2013-0007923 | 1/2013 |
| KR | 2017-0083446 | 7/2017 |
| KR | 10-2017-0089726 A | 8/2017 |
| KR | 2017-0137562 | 12/2017 |
| KR | 2019-0088196 | 7/2019 |

* cited by examiner

- ⬢ Selected cell
- ○ Unselected cell
- ◉ Half-selected cell with high $I_{leak}$
- ◉ Half-selected cell with low $I_{leak}$

MULTI-LAYER SELECTOR DEVICE AND METHOD OF FABRICATING THE SAME

TECHNICAL FIELD

The technical idea of the present invention relates to a semiconductor device, and more particularly, to a multi-layer selector device and a method of fabricating the same.

BACKGROUND ART

As a next-generation memory structure, a cross-point array structure is likely to be used in a high-density memory device. However, such a cross-point array structure may cause write errors and read errors due to current leaking from neighboring cells, and thus it is difficult to increase the size of the array. Therefore, a selector device capable of suppressing such leakage current is required. To date, as such selector devices, tunnel barrier, mixed-ionic-electronic conduction MIEC, insulator-metal-transition IMT, ovonic threshold switching OTS, and a diode-type selector have been proposed. However, there is a problem that the leakage current still appears at a high level even in the selector devices.

PRIOR ART

KR application No. 10-2016-0010338

DISCLOSURE OF THE INVENTION

Technical Problem

The technical problem to be achieved by the technical idea of the present invention is to provide a multi-layer selector device exhibiting low leakage current and a method of fabricating the same. However, these tasks are exemplary, and the technical spirit of the present invention is not limited thereto.

Technical Solution

According to one aspect of the present invention, a multi-layer selector device comprises: a substrate; a lower electrode layer disposed on the substrate; a switching layer disposed on the lower electrode layer, performing a switching operation by forming and destroying a conductive filament, and made of a multi-layer to control the formation of the conductive filament; and an upper electrode layer disposed on the switching layer.

According to an embodiment of the present invention, the switching layer may include: a metal doped layer doped with a metal forming the conductive filament; a conductive filament forming layer in which a conductive filament is formed or destroyed by the metal; and a threshold voltage control layer configured to control the threshold voltage by controlling the formation of the conductive filament.

According to an embodiment of the present invention, the switching layer may include a threshold voltage control layer disposed on the lower electrode layer; a conductive filament forming layer disposed on the threshold voltage control layer; and a metal doped layer disposed on the conductive filament forming layer.

According to an embodiment of the present invention, the switching layer may include: a first threshold voltage control layer disposed on the lower electrode layer; a conductive filament forming layer disposed on the first threshold voltage control layer; a metal doped layer disposed on the conductive filament forming layer; and a second threshold voltage control layer disposed on the metal doped layer.

According to an embodiment of the present invention, the switching layer may include: a first threshold voltage control layer disposed on the lower electrode layer; a metal doping layer disposed on the first threshold voltage control layer; a conductive filament forming layer disposed on the metal doped layer; and a second threshold voltage control layer disposed on the conductive filament forming layer.

According to an embodiment of the present invention, the switching layer may include a first metal doped layer disposed on the lower electrode layer; a first conductive filament forming layer disposed on the first metal doped layer; a threshold voltage control layer disposed on the first conductive filament forming layer; a second conductive filament forming layer disposed on the threshold voltage control layer; and a second metal doped layer disposed on the second conductive filament forming layer.

According to an embodiment of the present invention, the switching layer may include a first conductive filament forming layer disposed on the lower electrode layer; a first metal doped layer disposed on the first conductive filament forming layer; a threshold voltage control layer disposed on the first metal doped layer; a second metal doped layer disposed on the threshold voltage control layer; and a second conductive filament forming layer disposed on the second metal doped layer.

According to an embodiment of the present invention, the metal doped into the metal doping layer moves to the conductive filament forming layer to form the conductive filament, and the conductive filament may electrically connect the upper electrode layer and the lower electrode layer.

According to an embodiment of the present invention, the conductive filament formed on the conductive filament forming layer may be formed when an electrical signal is applied.

According to an embodiment of the present invention, the conductive filament formed on the conductive filament forming layer may have a volatile characteristic that is formed when an electrical signal is applied and is destroyed when the electrical signal is removed.

According to an embodiment of the present invention, in the switching layer, the multi-layer may have a gradient of doping concentration of the metal forming the conductive filament.

According to an embodiment of the present invention, the switching layer includes a first metal doped layer disposed on the lower electrode and doped with a metal forming the conductive filament, a conductive filament forming layer disposed on the first metal doped layer and in which the conductive filament is formed or destroyed, and a second metal doped layer disposed on the conductive filament forming layer and doped with a metal forming the conductive filament.

According to an embodiment of the present invention, an adhesive layer interposed between the substrate and the lower electrode layer to bond the substrate and the lower electrode layer to each other may be further included.

According to an embodiment of the present invention, the method of fabricating the multi-layer selector device includes: providing a substrate; forming a lower electrode layer on the substrate; forming an insulating layer on the lower electrode layer; removing a portion of the insulating layer to form a via hole exposing the lower electrode layer; forming a switching layer including a multi-layer to control the formation of the conductive filament in the via hole; and forming an upper electrode layer on the switching layer.

According to an embodiment of the present invention, after forming the upper electrode layer, the method may further include annealing the multi-layer selector device at a temperature of 100° C. to 500° C.

Advantageous Effects

According to the technical concept of the present invention, it is possible to provide a threshold switching selector device having a controllable threshold voltage in a wide range by inserting a threshold voltage control layer made of silicon oxide SiO2.

In addition, by using such a multi-layer structure, it is possible to prevent excessive inflow of silver ions in a high on-current state, thereby easily controlling the formation of conductive filaments.

This multi-layer selector device uses the formation of conductive filaments by movement of ions, and can realize a cross-point array memory with advantages of a simple structure, CMOS compatibility, and high selectivity. In general, it is difficult to control the formation of conductive filaments, so the non-uniformity and reliability of the selector device can be a problem. Here, a multi-layer selector device including a zinc oxide layer doped with silver has been proposed. Using such a multi-layer structure, it is possible to prevent excessive inflow of silver ions in a high on-current state, thereby easily controlling the formation of conductive filaments.

In addition, the multi-layer selector device may have a tunable threshold voltage characteristic of a multi-layer structure by inserting a threshold voltage control layer made of silicon oxide.

According to the concept of the present invention, it is possible to reduce the leakage current of the high-density cross-point array device by controlling the threshold voltage using a multi-layer selector device having a wide range of controllable threshold voltage characteristics.

The above-described effects of the present invention have been described by way of example, and the scope of the present invention is not limited by these effects.

MODE FOR INVENTIONS

Figure 1A:
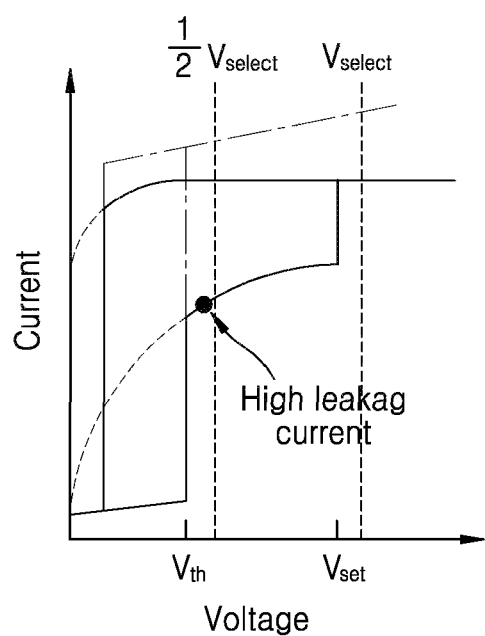
FIGS. 1A and 1B are graphs illustrating relationships between a threshold voltage and a leakage current for a multi-layer selector device according to an embodiment of the present invention.

Hereinafter, preferred embodiments of the present invention will be described in detail with reference to the accompanying drawings. The embodiments of the present invention are provided to more completely explain the technical idea of the present invention to those of ordinary skill in the art, and the following examples may be modified in various other forms. The scope of the technical idea is not limited to the following examples. Rather, these embodiments are provided so as to more fully and complete the present disclosure, and to fully convey the technical spirit of the present invention to those skilled in the art. In this specification, the same reference numerals refer to the same elements throughout. Furthermore, various elements and regions in the drawings are schematically drawn. Accordingly, the technical spirit of the present invention is not limited by the relative size or spacing drawn in the accompanying drawings.

Three-dimensional cross-point arrays based on two-terminal memristor have been evaluated as next-generation technologies due to advantages of their simple structure, high-density, and CMOS compatibility. However, the cross-point array memory is suffering from the leakage current induced from memory cells exist at the intersection of two accessing lines. These disturbances limit the maximum size of the array and make the memory device difficult to operate. To overcome these problems, various devices have been studied for the highly integrated memory structure, including insulator-metal transition IMT, the mixed-ionic-electronic conduction MIEC and ovonic threshold switch OTS. However, these types of selector devices still face a high leakage current issue due to the high off-current $I_{off}$ of the devices.

Electrochemical metallization ECM-based selectors may be considered due to low leakage current. As a method for realizing a low leakage current, ECM-based selector devices may be considered. The selector devices can suppress leakage current of nonvolatile memory devices, and are an important component in a high-density cross-point array device. Atomic switch-based selector devices use the formation and destruction of conductive filaments, and have the advantage of low leakage current.

However, the ECM-based selector device has a low threshold voltage characteristic that causes incompatibility with the operating voltage range of the memory device during the cross-point array operation, cannot effectively reduce the leakage current, and may cause a sensing error. In other words, in order to maintain the low leakage current characteristic of the ECM-based selector device, the threshold voltage of the selector device needs to be matched with the operating voltage of the memory device.

For this electrochemical metallization, a selector device may be configured by including a solid electrolyte and an active metal such as silver Ag or copper Cu. The selector devices are operated by volatile conductive filaments formed by application of an electric field. When an electric field is applied to the selector device, volatile conductive filaments are formed in the solid electrolyte, and when the electric field is removed, the volatile conductive filaments are spontaneously destroyed. When these ECM-based selector devices are operated in connection with a resistive switching memory RSM, the selector devices are required to have a high on-current (Ion) to provide sufficient current for the operation of the resistive switching memory.

However, when the selector device operates in a high on-current state of 10 μA or more, nonvolatile conductive filaments are formed by the influx of excessive metal atoms from the active electrode. Such nonvolatile conductive filaments generate nonvolatile memory characteristics. In addition, since it is difficult to control the formation of the non-volatile conductive filaments, non-uniform threshold switching behavior may be caused.

Therefore, there is a need to prevent excessive influx of metal atoms for reliable threshold switching behavior. In order to prevent such excess inflow, a multilayer structure having different concentrations of silver may be applied to the selector devices, so that the amount of metal atoms introduced through concentration control can be controlled, and the selectivity and reliability of the device can be increased.

Figure 1B:
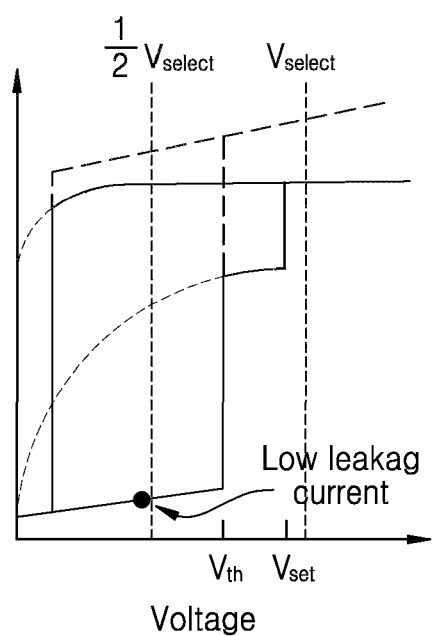

FIGS. 1A and 1B are graphs illustrating relationships between a threshold voltage and a leakage current for a multi-layer selector device according to an embodiment of the present invention.

Referring to FIG. 1A, in a cross-point array memory device including one selector-one resistor 1S-1R, when half of all cells are selected to perform a memory operation, a selection voltage $V_{select}$ is applied to the selected cells, and a ½ selection voltage ½$V_{select}$ is applied to unselected neighboring cells. The ½ selection voltage ½$V_{select}$ is smaller than the selection voltage $V_{select}$. When the threshold voltage $V_{th}$ of the selector device 1S is smaller than the ½ selection voltage ½$V_{select}$, the selector device is in an on-state during a write operation. In this case, the leakage current of the cross-point array memory device is large, and even when the selector device has a low off current Ioll and high selectivity, the leakage current is not suppressed and has a large value.

Referring to FIG. 1B, when the threshold voltage $V_{th}$ of the selector device is greater than the ½ selection voltage ½$V_{select}$, the selector devices of neighboring cells are maintained in an off-state, the selector device of the selected cell is turned on. In this case, the leakage current of the cross-point array memory device may appear small.

Accordingly, in order to prevent leakage current caused by the neighboring cells, the threshold voltage of the selector device should have a higher value than the ½ selection voltage. Furthermore, in order to reduce the leakage current of the cross-point array memory device, the selector device must have an appropriate threshold voltage characteristic and it is necessary to control the threshold voltage.

According to the technical spirits of the present invention, in order to control the threshold voltage of such an electrochemical metallization-based selector device, a multi-layered switching layer is proposed. This multi-layer structure can control defects, in which metal ions can migrate, and increase the interface between switching layers to control filament formation and destruction.

Figure 2:
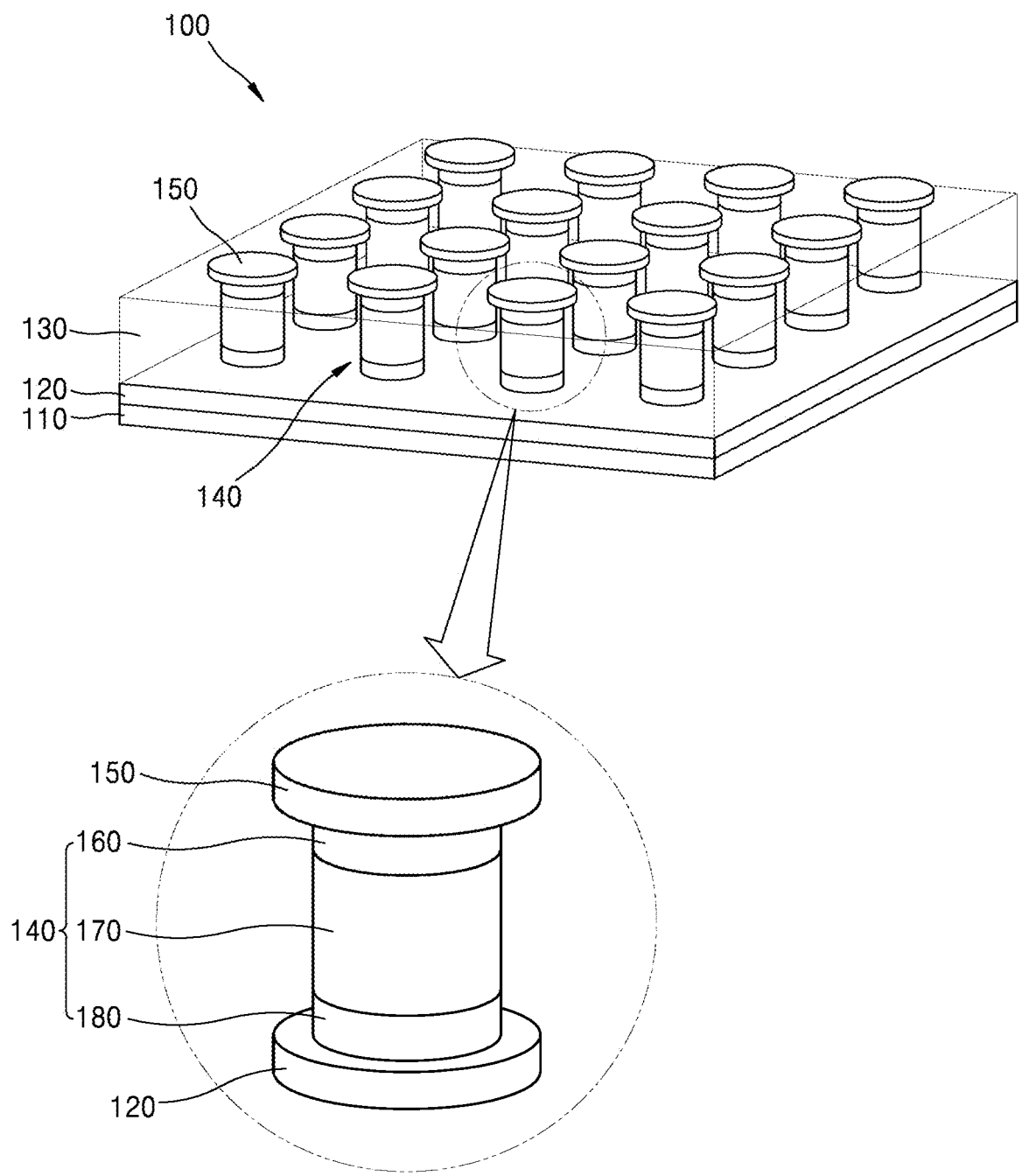
FIG. 2 is a schematic diagram showing the multi-layer selector device 100 according to an embodiment of the present invention.
Figure 3:
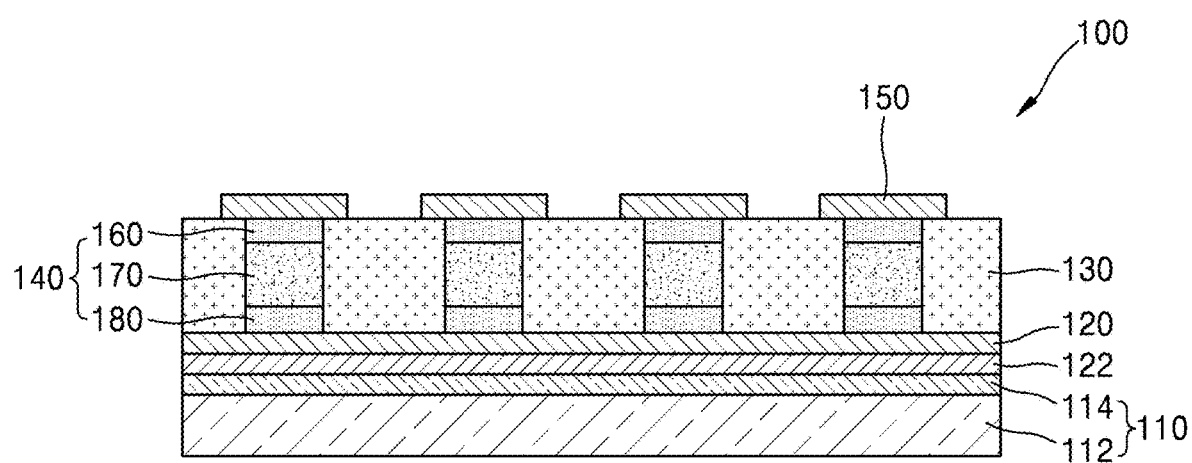
FIG. 3 is a cross-sectional view showing the multi-layer selector device 100 according to an embodiment of the present invention.

FIG. 2 is a schematic diagram showing the multi-layer selector device 100 according to an embodiment of the present invention, and FIG. 3 is a cross-sectional view showing the multi-layer selector device 100 according to an embodiment of the present invention.

Referring to FIG. 2 and FIG. 3, the multilayer selector device 100 includes a substrate 110, a lower electrode layer 120, an insulating layer 130, a switching layer 140, and an upper electrode layer 150.

Specifically, the multilayer selector device 100 includes a substrate 110, a lower electrode layer 120 disposed on the substrate, an insulating layer 130 disposed on the lower electrode layer and having a via hole passing through to expose the lower electrode layer, a switching layer 140 located on the lower electrode layer in the via hole, performing a switching operation by forming and breaking a conductive filament, and having a multi-layers to control the formation of the conductive filament, and an upper electrode layer 150 on the switching layer 140.

The substrate 110 may include various substrates. The substrate 110 may be configured by, for example, a silicon layer 112 and a silicon oxide layer 114 disposed on the silicon layer 112. However, this is exemplary and the technical spirit of the present invention is not limited thereto.

The lower electrode layer 120 may be disposed on the substrate 110. The lower electrode layer 120 may include a conductive material, for example, at least one of platinum, aluminum, copper, gold, silver, iron, palladium, titanium, zinc, molybdenum, tungsten, nickel, niobium, rubidium, iridium, and alloys thereof.

In addition, an adhesive layer 122 interposed between the substrate 110 and the lower electrode layer 120 to bond the substrate 110 and the lower electrode layer 120 to each other may be further included. The adhesion between the substrate 110 and the lower electrode layer 120 may be strengthened by the adhesive layer 122, and uniform adhesion may be achieved. The adhesive layer 122 may include, for example, titanium, titanium nitride, silicon, aluminum, and iridium. However, in some other embodiments, the adhesive layer may be omitted.

The insulating layer 130 may be disposed on the lower electrode layer 120. The insulating layer 130 may include a plurality of via holes 135 penetrating to expose the lower electrode layer 120. The insulating layer 130 may form a sidewall of the switching layer 140 to individualize the switching layer 140. The insulating layer 130 may include various insulating materials, and may include, for example, at least one of silicon oxide, silicon nitride, silicon oxynitride, hafnium oxide, titanium oxide, tantalum oxide, aluminum oxide, and zirconium oxide.

The switching layer 140 may be disposed on the lower electrode layer 120 in the via hole 135. The switching layer 140 may perform a switching operation by forming and breaking a conductive filament. Furthermore, the switching layer 140 may be formed of multiple layers to control the threshold voltage by controlling the formation of the conductive filament.

The upper electrode layer 150 may be disposed on the switching layer 140. The upper electrode layer 150 may be formed separately in each of the individualized switching layers 140. The upper electrode layer 150 may include a conductive material, for example, at least one of platinum, aluminum, copper, gold, silver, iron, palladium, titanium, zinc, molybdenum, tungsten, nickel, niobium, rubidium, iridium, and alloys thereof.

Hereinafter, the switching layer 140 of the multi-layer selector device 100 will be described in detail.

The switching layer 140 may include a metal doped layer 160, a conductive filament forming layer 170, and a threshold voltage control layer 180.

Specifically, the switching layer 140 may include the metal doped layer 160 doped with a metal forming the conductive filament; the conductive filament forming layer 170 in which the conductive filament is formed or destroyed by the metal; and the threshold voltage control layer 180 for controlling a threshold voltage by controlling the formation of the conductive filament.

The metal doped layer 160 may be doped with a metal forming the conductive filament. The metal doped layer 160 may include an insulating material as a matrix, for example, zinc oxide, indium oxide, indium-zinc oxide, indium-gallium oxide, zinc-tin oxide, aluminum-zinc oxide, gallium-zinc oxide, indium-zinc-tin oxide, indium-gallium-zinc oxide, indium-gallium-tin oxide, hafnium oxide, hafnium-zirconium oxide, zirconium oxide, tantalum oxide, titanium oxide, tungsten oxide, manganese oxide, nickel oxide, and at least one of magnesium oxide. In addition, the metal doped layer 160 may be doped with a metal in the insulating material, for example, at least one of silver, copper, iron, gold, titanium, zinc, magnesium, and tin being doped. The metal doped layer 160 may have a metal doping concentration in the range of, for example, 0.01% to 50%.

In the conductive filament forming layer 170, the conductive filament may be formed or destroyed by the metal therein. The conductive filaments may be formed or destroyed in the following manner. In the multi-layer selector device in which the conductive filament made of silver is formed, when a voltage is applied, silver ions move to the conductive filament forming layer, and a conductive filament is formed in the conductive filament forming layer by an oxidation-reduction reaction. At the threshold voltage, the conductive filament expands to electrically connect the upper electrode and the lower electrode. Accordingly, the resistance of the multi-layer selector device is changed from the off-state to the on-state. On the other hand, when the applied voltage is removed, the conductive filaments are decomposed into silver ions, and the decomposition may be accelerated by the Rayleigh instability effect.

The conductive filament forming layer 170 may include an insulating material as a matrix, for example, at least one of zinc oxide, indium oxide, indium-zinc oxide, indium-gallium oxide, zinc-tin oxide, aluminum-zinc oxide, gallium-zinc oxide, indium-zinc-tin oxide, indium-gallium-zinc oxide, indium-gallium-tin oxide, hafnium oxide, hafnium-zirconium oxide, zirconium oxide, tantalum oxide, titanium oxide, tungsten oxide, manganese oxide, nickel oxide, and magnesium oxide. The conductive filament forming layer 170 may be configured not to be doped with a metal. Alternatively, in the conductive filament forming layer 170, the insulating material may be doped with a metal, and for example, at least one of silver, copper, iron, gold, titanium, zinc, magnesium, and tin may be doped. The conductive filament forming layer 170 may have, for example, a metal doping concentration in the range of 0.01% to 50%.

Insulating material constituting each of the metal doped layer 160 and the conductive filament forming layer 170 may be the same or different from each other. Also, the metal doping layer 160 and the conductive filament forming layer 170 may have different metal doping concentrations. The metal doping concentration of the metal doping layer 160 may be greater than the metal doping concentration of the conductive filament forming layer 170.

The threshold voltage control layer 180 may include a material that controls, for example, suppresses the formation of the conductive filament. Specifically, the threshold voltage control layer 180 may include a material that suppresses diffusion of the metal discharged from the metal doping layer 160 to form the conductive filament. However, the threshold voltage control layer 180 should not completely block the diffusion of the metal. In order to control the diffusion of the metal, the material, the quality, and the thickness of the layer need to be controlled to specifically suppress but not completely block the diffusion of the metal. For example, by forming the threshold voltage control layer 180 using an atomic layer deposition method, a layer having a relatively dense quality may be formed and a layer having a relatively thin thickness may be formed.

The threshold voltage control layer 180 may include various insulating materials, for example, at least one of silicon oxide, silicon nitride, silicon oxynitride, hafnium oxide, titanium oxide, tantalum oxide, aluminum oxide, and zirconium oxide.

The metal doped layer 160 may have a thickness of, for example, 3 nm to 20 nm. The conductive filament forming layer 170 may have a thickness of, for example, 15 nm to 50 nm. The threshold voltage control layer 180 may have a thickness of, for example, 1 nm to 5 nm. However, this thickness is exemplary and the technical spirit of the present invention is not limited thereto.

In addition, the multi-layer selector device according to an embodiment of the present invention includes a case that does not include an insulating layer having a via hole. For example, a multi-layer selector device according to an embodiment of the present invention includes a substrate; a lower electrode layer disposed on the substrate; a switching layer disposed on the lower electrode layer, performing a switching operation by forming and destroying a conductive filament, and comprising a multi-layer switching layer to control a threshold voltage by controlling the formation of the conductive filament; and an upper electrode layer disposed on the switching layer.

Figure 4A:
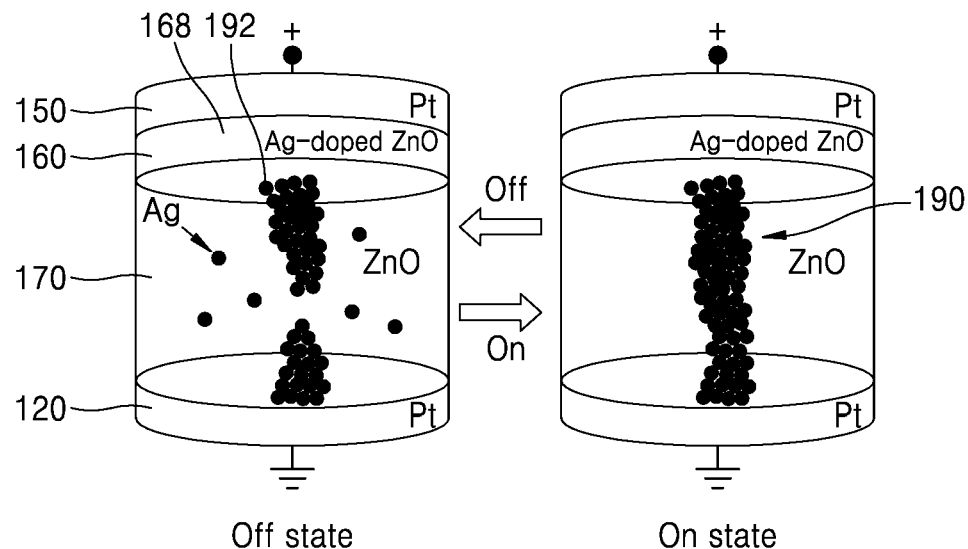
FIGS. 4A and 4B are schematic diagrams illustrating the formation and destruction of a conductive filament 190 in the multi-layer selector device 100 according to an embodiment of the present invention.
Figure 4B:
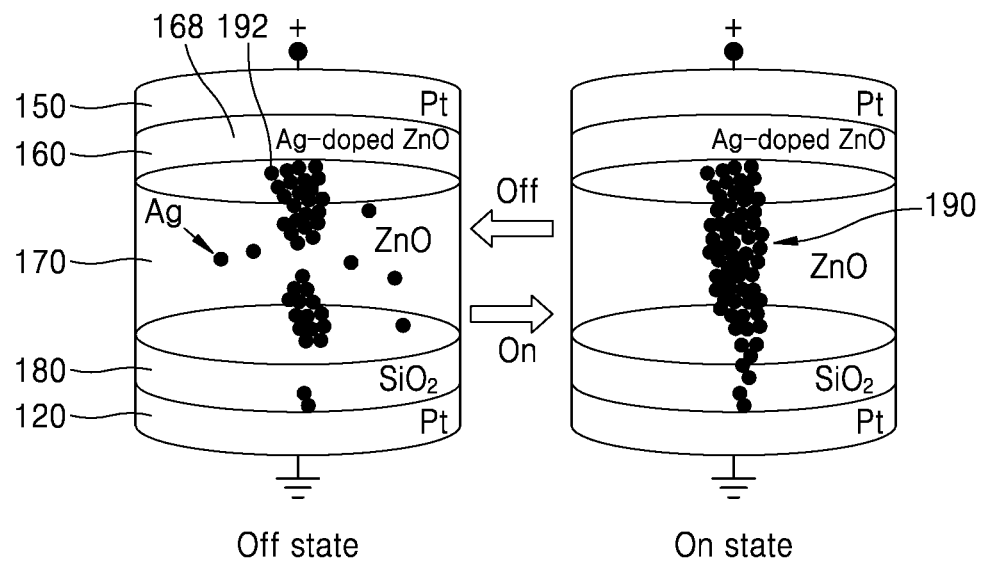

FIGS. 4A and 4B are schematic diagrams illustrating the formation and destruction of a conductive filament 190 in the multi-layer selector device 100 according to an embodiment of the present invention.

Referring to FIG. 4A, as a comparative example, the threshold voltage control layer 180 is not included. The formation and destruction of the conductive filaments 190 in the conductive filament forming layer 170 are shown.

In the OFF state where no electrical signal is applied from the outside or a low level is applied, a conductive filament cannot be formed and specifically, the metal 192 discharged from the metal doped layer 160 cannot electrically connect the lower electrode layer 120 and the upper electrode layer 150. For example, the metal doped layer 160 may exist by doping the metal 192 in the insulator matrix 168. The metal may not be doped in the conductive filament forming layer 170, or may be doped to a level that does not form the conductive filament 190.

Even when an electrical signal is applied from the outside and the metal 192 moves from the metal doped layer 160 to the conductive filament forming layer 170, if the conductive filament 190 connecting the lower electrode layer 120 and the upper electrode layer 150 is not formed, it does not exhibit threshold switching behavior, and the off-state is continuously maintained. That is, the conductive filament 190 can be formed only when an electrical signal equal to or greater than the threshold voltage is applied.

When an electrical signal is applied from the outside to a certain level or more and the device is turned on, the metal 192 forms a conductive filament 190 in the conductive filament forming layer 170, and thus the lower electrode layer 120 and the upper electrode layer 150 are electrically connected. The electrical signal becomes a voltage greater than or equal to a threshold voltage. Accordingly, the threshold switching behavior is enabled by the formation of the conductive filament 190.

The movement of the metal 192 in the on state may be performed as follows. When an electrical signal is applied to the lower electrode layer 120 and the upper electrode layer 150 from the outside at a certain level or more, the doped metal 192 of the metal doped layer 160 moves to the conductive filament forming layer 170 to form a conductive filament 190. When the metal 192 moves, the metal 192 may move to an atomic state or move to a cation state. By forming the conductive filament 190, the lower electrode layer 120 and the upper electrode layer 150 may be electrically connected. Specifically, the lower electrode layer 120, the conductive filament forming layer 170, the metal doped layer 160, and the upper electrode layer 150 may be physically connected to form an electrical path.

When it is the OFF state again, the conductive filament 190 may be destroyed, and the metal 192 constituting the conductive filament 190 may move back to the metal doped layer 160. Accordingly, the conductive filament 190 may have volatile properties. However, this is exemplary and the case where the conductive filament 190 has non-volatile properties is also included in the technical spirit of the present invention.

Referring to FIG. 4B, as an embodiment, the threshold voltage control layer 180 is included. Similar to the above-described comparative example, the conductive filament 190 may be formed and destroyed. By the formation of the conductive filament 190, the lower electrode layer 120, the threshold voltage control layer 180, the conductive filament forming layer 170, the metal doped layer 160 and the upper electrode layer 150 are physically connected to form an electrical path.

However, in the case of the embodiment, since it further includes a threshold voltage control layer 180 capable of suppressing the formation of the conductive filament 190, the conductive filament 190 formed on the threshold voltage control layer 180 may be formed under a relatively high voltage, and may have a relatively small dimension rather than in the comparative example. That is, in order to form the conductive filament 190, the metal 192 must move to the threshold voltage control layer 180. Since the movement of the metal 192 in the threshold voltage control layer 180 is relatively difficult compared to the conductive filament forming layer 170, the threshold voltage may be increased.

The metal doping layer 160, the conductive filament forming layer 170, and the threshold voltage controlling layer 180 constituting the switching layer 140 may be disposed in various ways as follows.

FIGS. 5A, 5B, 5C, 5D, 5E, and 5F are cross-sectional views showing a switching layer of the multi-layer selector device 100 according to an embodiment of the present invention.

Figure 5A:
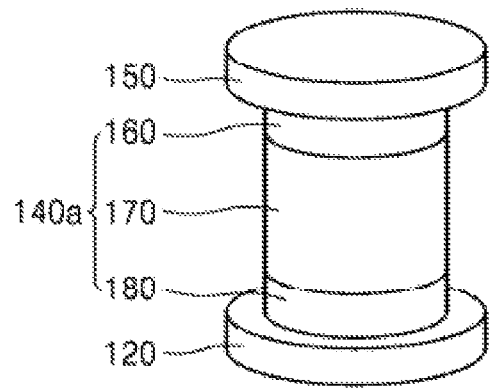
FIGS. 5A, 5B, 5C, 5D, 5E, and 5F are cross-sectional views showing a switching layer of the multi-layer selector device 100 according to an embodiment of the present invention.
Figure 5B:
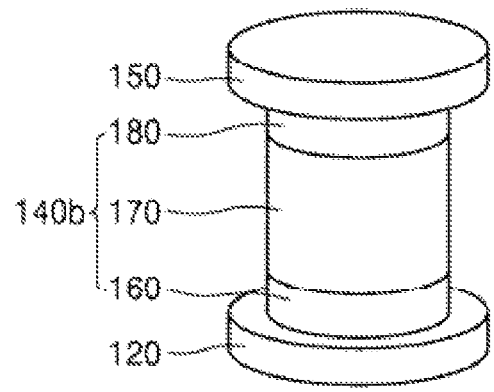

Referring to FIG. 5B, the switching layer 140b includes a metal doped layer 160 disposed on the lower electrode layer 120; a conductive filament forming layer 170 disposed on the metal doped layer 160; and a threshold voltage control layer 180 disposed on the conductive filament forming layer 170.

In this case, the lower electrode layer 120, the metal doped layer 160, the conductive filament forming layer 170, the threshold voltage control layer 180, and the upper electrode layer 150 may be stacked in this order.

Meanwhile, the threshold voltage control layer 180 may be formed in plurality. The threshold voltage control layer 180 may include a first threshold voltage control layer 181 disposed on a lower side and a second threshold voltage control layer 182 disposed on an upper side. The first threshold voltage control layer 181 may be in physical contact with the lower electrode layer 120. The second threshold voltage control layer 182 may be in physical contact with the upper electrode layer 150.

Figure 5C:
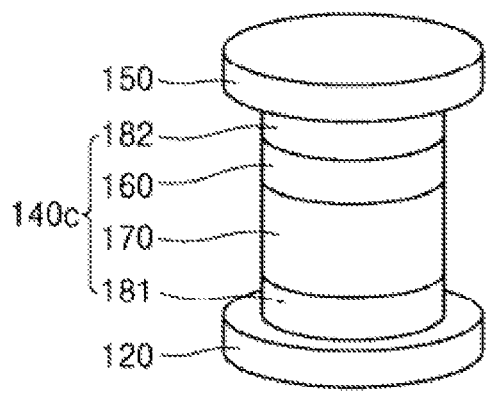

Referring to FIG. 5C, the switching layer 140c includes a first threshold voltage control layer 181 disposed on the lower electrode layer 120; a conductive filament forming layer 170 disposed on the first threshold voltage control layer 181; a metal doped layer 160 disposed on the conductive filament forming layer 170; and a second threshold voltage control layer 182 disposed on the metal doped layer 160. In this case, the lower electrode layer 120, the first threshold voltage controlling layer 181, the conductive filament forming layer 170, the metal doping layer 160, the second threshold voltage controlling layer 182, and the upper electrode layer 150 may be stacked in this order.

Figure 5D:
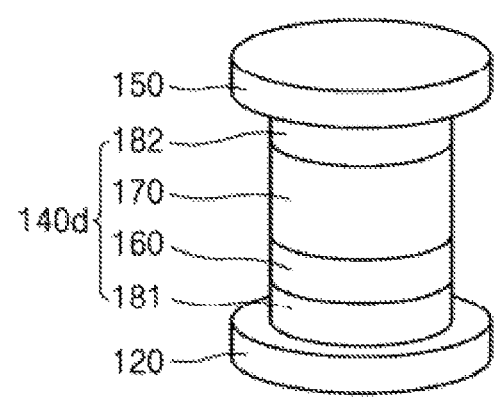

Referring to FIG. 5D, the switching layer 140d includes a first threshold voltage control layer 181 disposed on the lower electrode layer 120; a metal doping layer 160 disposed on the first threshold voltage control layer 181; a conductive filament forming layer 170 disposed on the metal doped layer 160; and a second threshold voltage control layer 182 disposed on the conductive filament forming layer 170. In this case, the lower electrode layer 120, the first threshold voltage controlling layer 181, the metal doping layer 160, the conductive filament forming layer 170, the second threshold voltage controlling layer 182, and the upper electrode layer 150 can be stacked in this order.

In addition, in the technical concept of the present invention, by combining the switching layer 140c and the switching layer 140d, the metal doped layer 160 may be disposed on the first threshold voltage control layer 181 and at the same time below the second threshold voltage control layer 182. That is, it is a case in which a plurality of metal doped layers 160 are further included. In this case, the lower electrode layer 120, the first threshold voltage control layer 181, the metal doped layer 160, the conductive filament forming layer 170, the metal doped layer 160, and the second threshold voltage control layer 182 and the upper electrode layer 150 may be stacked in this order.

In addition, according to the spirit of the present invention, it may further include a plurality of conductive filament forming layers 170. In this case, the lower electrode layer 120, the first threshold voltage control layer 181, the conductive filament formation layer 170, the metal doping layer 160, the conductive filament formation layer 170, and the second threshold voltage control layer 182, and the upper electrode layer 150 may be stacked in this order.

The metal doped layer 160 and the conductive filament forming layer 170 may be formed in plurality, respectively. The metal doped layer 160 may include a first metal doped layer 161 disposed on a lower side and a second metal doped layer 162 disposed on an upper side thereof. The conductive filament-forming layer 170 may include a first conductive filament-forming layer 171 disposed on a lower side and a second conductive filament-forming layer 172 disposed on an upper side thereof.

Figure 5E:
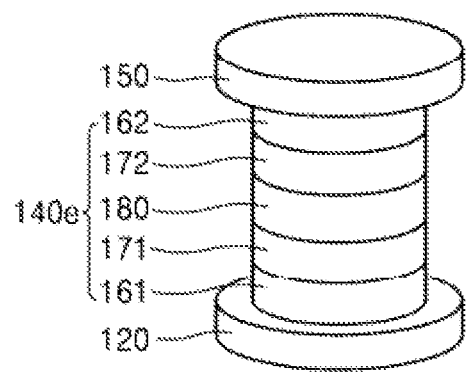

Referring to FIG. 5E, the switching layer 140e includes a first metal doped layer 161 disposed on the lower electrode layer 120; a first conductive filament forming layer 171 disposed on the first metal doped layer 161; a threshold voltage control layer 180 disposed on the first conductive filament forming layer 171; a second conductive filament forming layer 172 disposed on the threshold voltage control layer 180; and a second metal doped layer 162 disposed on the second conductive filament forming layer 172. In this case, the lower electrode layer 120, the first metal doped layer 161, the first conductive filament formation layer 171, the threshold voltage control layer 180, the second conductive filament formation layer 172, and the second metal doped layer 162, and the upper electrode layer 150 may be stacked in this order.

Figure 5F:
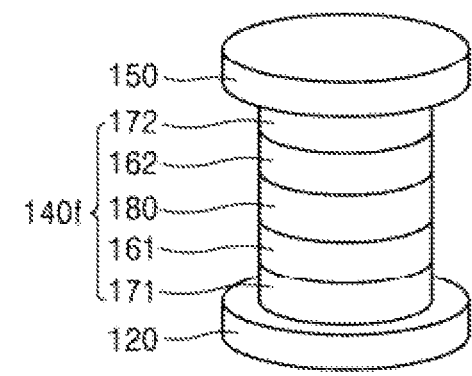

Referring to FIG. 5F, the switching layer 140f includes a first conductive filament forming layer 171 disposed on the lower electrode layer 120; a first metal doped layer 161 disposed on the first conductive filament forming layer 171; a threshold voltage control layer 180 disposed on the first metal doped layer 161; a second metal doped layer 162 disposed on the threshold voltage control layer 180; and a second conductive filament forming layer 172 disposed on the second metal doped layer 162. In this case, the lower electrode layer 120, the first conductive filament forming layer 171, the first metal doped layer 161, the threshold voltage control layer 180, the second metal doped layer 162, and the second conductive filament forming layer 172, and the upper electrode layer 150 may be stacked in this order.

In FIGS. 5E and 5F, a case in which any one of the first metal doped layer 161 and the first conductive filament forming layer 171 is omitted is also included in the technical concept of the present invention. In addition, a case in which any one of the second metal doped layer 162 and the second conductive filament forming layer 172 is omitted is also included in the technical concept of the present invention.

FIGS. 6 to 10 are cross-sectional views illustrating a method of fabricating a multi-layer selector device according to an embodiment of the present invention according to process steps.

In FIGS. 6 to 10, the formation and removal of various layers for forming the multi-layer selector device can be performed using a chemical vapor deposition method, a physical vapor deposition method, and a lithography method well known in the art, so detailed descriptions are to be omitted. The method of fabricating the multi-layer selector device may be implemented by applying a conventional CMOS technology.

Figure 6:
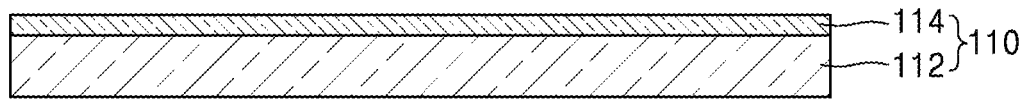
FIGS. 6 to 10 are cross-sectional views illustrating a method of fabricating a multi-layer selector device according to an embodiment of the present invention according to process steps.

Referring to FIG. 6, a substrate 110 is provided. The substrate 110 may be configured by stacking a silicon layer 112 and a silicon oxide layer 114.

Figure 7:
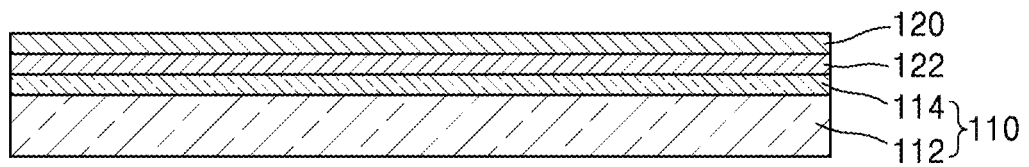

Referring to FIG. 7, the lower electrode layer 120 is formed on the substrate 110. Optionally, before forming the lower electrode layer 120, the adhesive layer 122 may be formed on the substrate 110. The adhesive layer 122 and the lower electrode layer 120 may be formed using, for example, electron beam evaporation.

Figure 8:
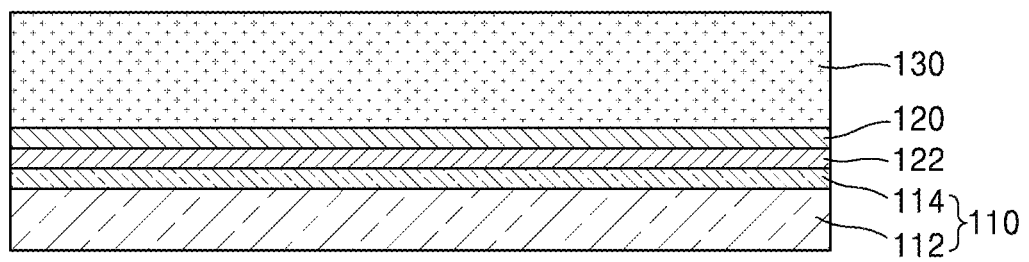

Referring to FIG. 8, the insulating layer 130 is formed on the lower electrode layer 120. The insulating layer 130 may be formed using, for example, plasma enhanced chemical vapor deposition PECVD.

Figure 9:
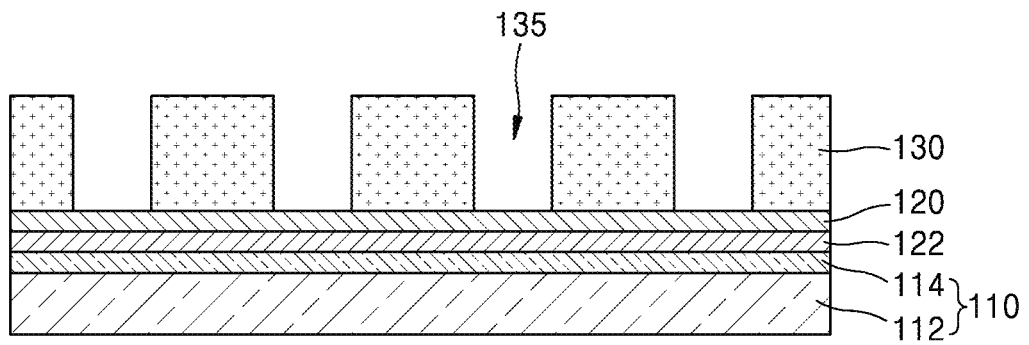

Referring to FIG. 9, a portion of the insulating layer 130 is removed to form a via hole 135 exposing the lower electrode layer 120. The via hole 135 may be formed using, for example, a KrF lithography method and a reactive ion etching method.

Figure 10:
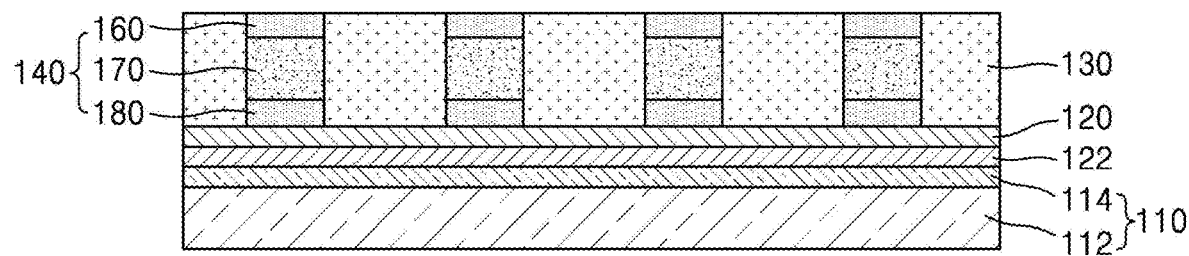

Referring to FIG. 10, a multi-layer switching layer 140 is formed in the via hole 135 to control the formation of the conductive filament to control the threshold voltage.

The forming of the switching layer 140 may include: forming a threshold voltage control layer 180 made of an insulating layer and controlling the formation of the conductive filament; forming a conductive filament forming layer 170 to form the conductive filament, on the threshold voltage control layer 180; and forming a metal doped layer 160 providing a metal to the conductive filaments, on the conductive filament forming layer 170.

Alternatively, the forming of the switching layer 140 may include: forming a metal doped layer 160 providing a metal to the conductive filament; forming a conductive filament forming layer 170 to form the conductive filament, on the metal doped layer 160; and forming, on the conductive filament forming layer 170, a threshold voltage control layer 180 including an insulating layer and controlling the formation of the conductive filament.

The metal doped layer 160 or the conductive filament forming layer 170 may be formed to have a gradient in the doping concentration of the metal by using simultaneous sputtering using both an oxide target and a metal target.

The threshold voltage control layer 180 may be formed using an atomic layer deposition method. Accordingly, a dense and thin layer can be formed.

Next, the upper electrode layer 150 is formed on the switching layer 140 to complete the multi-layer selector device 100 of FIG. 2. The upper electrode layer 150 may be formed using, for example, electron beam evaporation.

In addition, the multi-layer selector device 100 may be additionally annealed at a temperature of 100° C. to 500° C.

EXPERIMENTAL EXAMPLES

Hereinafter, preferred experimental examples are presented to help the understanding of the present invention. However, the following experimental examples are only for helping understanding of the present invention, and the present invention is not limited by the following experimental examples.

Fabrication of Multi-layer Selector Devices

A SiO2/Si substrate in which a silicon oxide SiO2 layer was formed on silicon Si was prepared. An adhesive layer and a lower electrode layer were sequentially formed on the substrate by electron beam evaporation. The adhesive layer had a thickness of about 10 nm and included titanium Ti. The lower electrode layer had a thickness of about 100 nm and included platinum Pt. Then, an insulating layer was formed on the lower electrode layer using plasma enhanced chemical vapor deposition PECVD. The insulating layer had a thickness of about 100 nm and included silicon oxide SiO2.

Then, a plurality of via holes passing through the insulating layer were formed using a KrF lithography method and a reactive ion etching method. The via holes had a diameter of 250 nm and a depth of 100 nm. The lower electrode layer was exposed through the via hole. The insulating layer patterned by the via holes is used to isolate cells of the multi-layer selector device.

Then, in the via hole, a silicon oxide layer was formed on the lower electrode layer at about 300° C. using an atomic layer deposition method. The silicon oxide layer had a thickness of about 2 nm or a thickness of about 4 nm.

Then, in the via hole, a zinc oxide layer was formed on the silicon oxide layer by sputtering. The zinc oxide layer was formed with a zinc oxide target of 99.99% purity in an Ar/O2 gas environment at a flow rate of 20/1 sccm. The sputtering was performed at a high frequency RF power of 150 W. The operating pressure of the sputtering chamber during the formation of the zinc oxide layer was 10 mTorr. The zinc oxide layer had a thickness of about 25 nm.

Then, in the via hole, a silver-doped zinc oxide layer was formed on the zinc oxide layer. The silver-doped zinc oxide layer was formed by forming a silver Ag target of 99.99% purity and a zinc oxide ZnO target of 99.99% purity in an Ar/O2 gas environment with a flow rate of 20/1 sccm. The silver-doped zinc oxide layers were deposited by co-sputtering. In this case, the high frequency RF power provided to the zinc oxide target was 150 W, and the direct current power provided to the silver target was 20 W. The operating pressure of the sputtering chamber during the formation of the silver-doped zinc oxide layer was 10 mTorr. The silver-doped zinc oxide layer had a thickness of about 5 nm.

Then, an upper electrode layer was formed on the silver-doped zinc oxide layer by sputtering at 75 W. The upper electrode layer had a thickness of about 60 nm and included platinum Pt.

The silicon oxide layer corresponds to the threshold voltage control layer 180, the zinc oxide layer or silver-undoped zinc oxide layer corresponds to the conductive filament forming layer 170, and the silver-doped zinc oxide layer corresponds to the metal doped layer 160.

It was then annealed for about 10 minutes at a temperature of 300° C. under atmospheric conditions. Accordingly, a multilayer selector device having a Pt/Ag-doped ZnO AZO/ZnO/SiO2/Pt structure was formed.

As a comparative example, a single-layer selector device having a Pt/AZO/ZnO/Pt structure was formed in the same manner. The comparative example is a case in which the silicon oxide layer is not included.

Fabrication of Resistive Switching Memory Devices

As described above, after preparing the SiO2/Si substrate and forming the adhesive layer, the lower electrode layer, and the insulating layer, a plurality of via holes passing through the insulating layer and exposing the lower electrode layer were formed.

Then, in the via hole, a ZrOx layer was formed on the lower electrode layer at about 280° C. using an atomic layer deposition method. To form the ZrOx layer, Zr[N(C2H5)CH3]4 TEMAZ was used as a zirconium precursor and ozone was used as an oxygen source. The ZrOx layer had a thickness of about 5 nm.

Then, in the via hole, a zinc oxide ZnO layer was deposited on the ZrOx layer at 150 W by sputtering. The operating pressure of the sputtering chamber during the formation of the zinc oxide layer was 10 mTorr. The zinc oxide layer had a thickness of about 15 nm.

Then, a titanium Ti layer was formed on the ZrOx layer by direct current sputtering using a titanium Ti target of 99.99% purity at room temperature, and then an upper electrode was formed on the titanium layer. During the sputtering, a DC sputtering power of 400 W was applied to the titanium target, and the working pressure of the sputtering chamber was 2 mTorr. The titanium layer could function as an adhesive layer and had a thickness of about 10 nm. The upper electrode layer had a thickness of about 100 nm and included titanium nitride TiN. Accordingly, a resistive switching memory device having a TiN/Ti/ZnO/ZrOx/Pt structure was completed.

Characterization of Multi-Layer Selector Devices

Electrical properties of the multi-layer selector device were measured at room temperature under atmospheric conditions using a semiconductor parameter analyzer 4200A-SCS, Keithley. The switching characteristics of the multi-layer selector device were measured using a pulse generator 33600A, Keysight and an oscilloscope TDS 5054, Tektronix. In order to analyze the electrical characteristics of the multi-layer selector device, a bias voltage was applied to the upper electrode made of platinum, and the lower electrode was grounded.

The cross-sectional microstructure of the multi-layer selector device was observed using a scanning electron microscope JSM-7800F Prime, JEOL.

Results and Discussion

Figure 11:
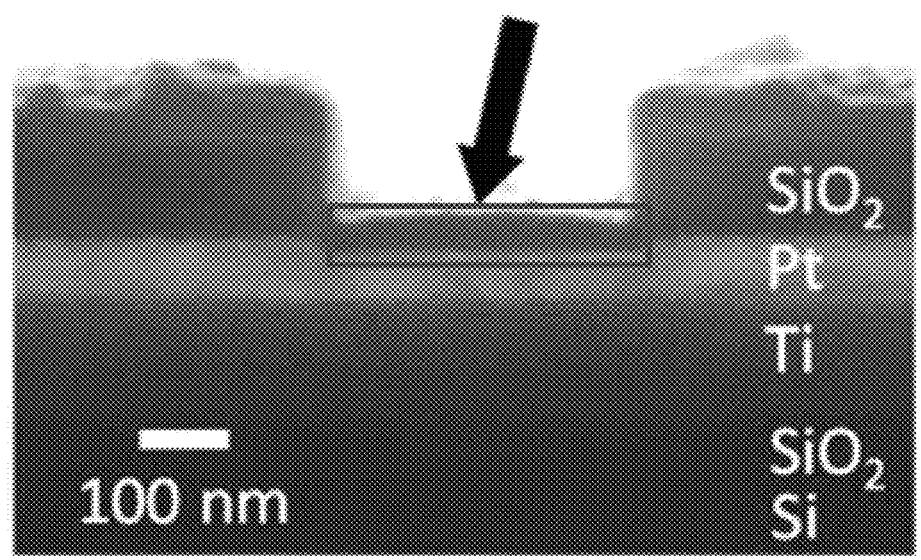
FIG. 11 is a scanning electron microscope photograph showing a cross-section of a multi-layer selector device according to an embodiment of the present invention.

FIG. 11 is a scanning electron microscope photograph showing a cross-section of a multi-layer selector device according to an embodiment of the present invention.

Referring to FIG. 11, an adhesive layer made of titanium Ti, a lower electrode layer made of platinum Pt, and an insulating layer made of silicon oxide SiO2 are formed on a Si/SiO2 substrate. A via hole is formed in a portion of the insulating layer. In the via hole, as indicated by a red region, a multilayer composed of SiO2/ZnO/AZO is formed on the lower electrode layer.

The silicon oxide layer SiO2 formed in the via hole is a threshold voltage control layer 180 and may perform a function of controlling a threshold voltage characteristic of the multi-layer selector device. The zinc oxide layer ZnO formed in the via hole is the conductive filament forming layer 170 and may function as a switching layer in which the conductive filament may be formed.

Figure 12A:
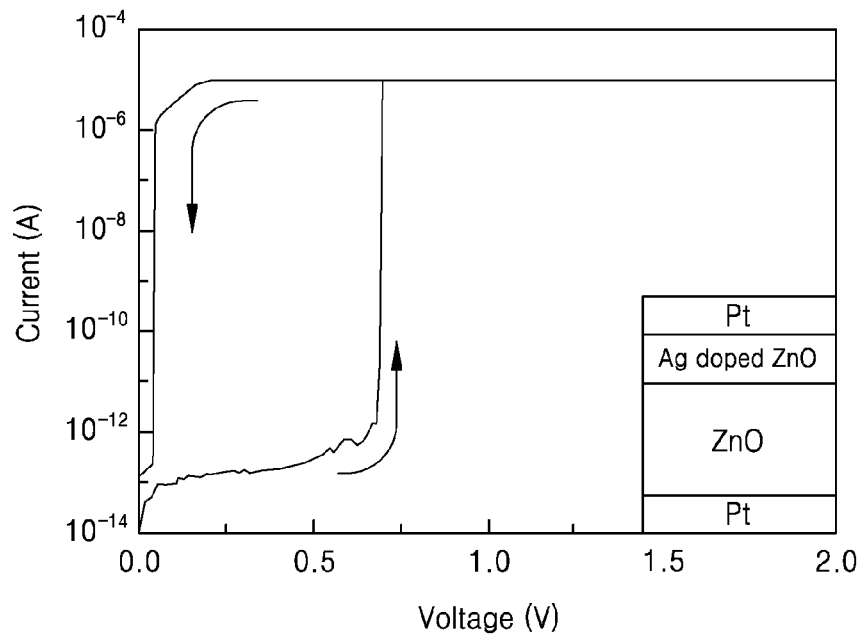
FIGS. 12A and 12B are graphs showing current-voltage characteristics of a multi-layer selector device according to an embodiment of the present invention.
Figure 12B:
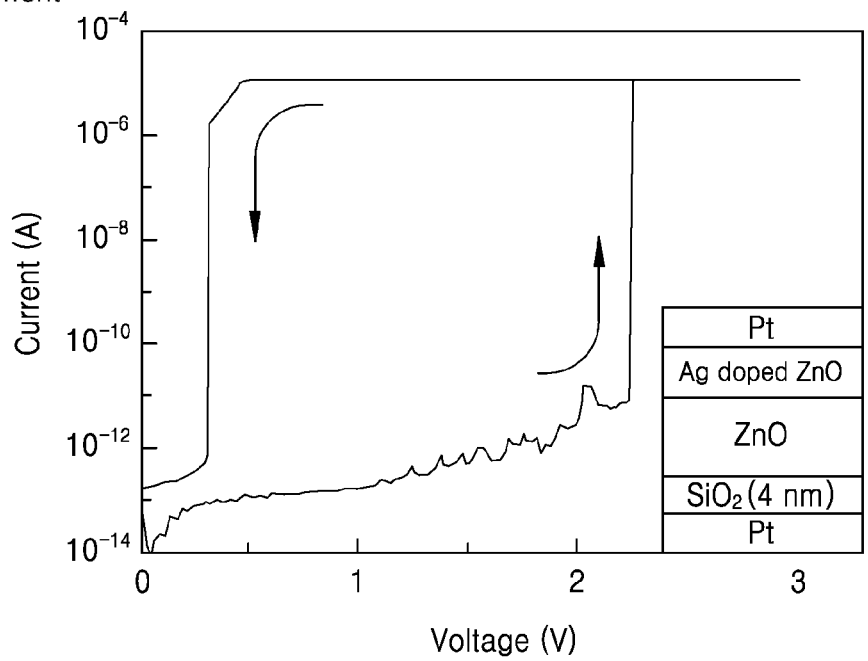

FIGS. 12A and 12B are graphs showing current-voltage characteristics of a multi-layer selector device according to an embodiment of the present invention.

Referring to FIGS. 12A and 12B, by measuring the current voltage I-V characteristics of the multi-layer selector device, the effect of the insertion of the threshold voltage control layer made of silicon oxide on the threshold switching characteristics is examined. During electrical measurements, an electrical bias was applied to the platinum upper electrode, and the platinum lower electrode was grounded.

Referring to FIG. 12A, as a comparative example, the threshold voltage control layer is not included. The comparative example had a low level of off current of $10^{-13}$ A. In addition, when the voltage was swept from 0 V to 3 V at a compliance current ICC of 10 µA, a threshold switching behavior was observed at a threshold voltage $V_{th}$ of 0.7 V. At this time, the resistance was changed from the high resistance state HRS to the low resistance state LRS at a rate of about $10^8$. Then, when the voltage is swept from 3 V to 0 V in the opposite direction, the low resistance state LRS to the high resistance state HRS is abruptly changed. The change in resistance from the high resistance state HRS to the low resistance state LRS is analyzed to be related to the formation of silver Ag conductive filaments in the zinc oxide ZnO switching layer.

Referring to FIG. 12B, as an embodiment, a threshold voltage control layer made of silicon oxide having a thickness of 4 nm is included. Embodiments have low levels of off current, for example from $10^{-14}$ A to $10^{-12}$ A, for example $10^{-13}$ A. In addition, an electroforming phenomenon was exhibited at 3 V at a compliance current $I_{CC}$ of 10 µA. After the electroforming of the device was performed, the voltage was swept from 0 V to 3 V to measure the threshold switching of the selector device. As a threshold switching behavior of the multi-layer selector device of the embodiment, a threshold voltage of 2.2 V, which is higher than that of the comparative example, was measured. At this time, the resistance was changed from the high resistance state HRS to the low resistance state LRS at a ratio of about $10^7$ to $10^8$. When the voltage is swept from 3 V to 0 V in the opposite direction, the voltage level is different but abruptly changed from the low resistance state LRS to the high resistance state HRS with a behavior similar to the comparative example.

Both the comparative example and the embodiment showed a threshold switching behavior with a low off-state current regardless of the presence of the threshold voltage control layer. However, it was confirmed that, in the embodiment having the threshold voltage control layer made of silicon oxide having a thickness of 4 nm, the threshold voltage was changed from 0.7 V to 2.2 V. Accordingly, the threshold voltage control layer may increase the threshold voltage.

Figure 13A:
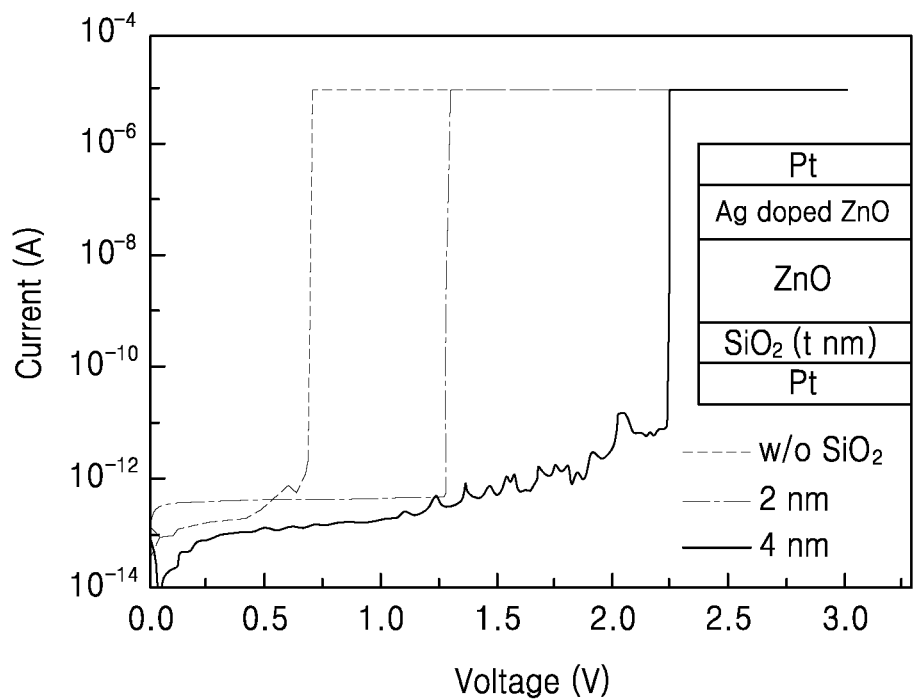
FIGS. 13A and 13B are graphs illustrating changes in electrical characteristics according to a thickness of a threshold voltage control layer of a multi-layer selector device according to an embodiment of the present invention.
Figure 13B:
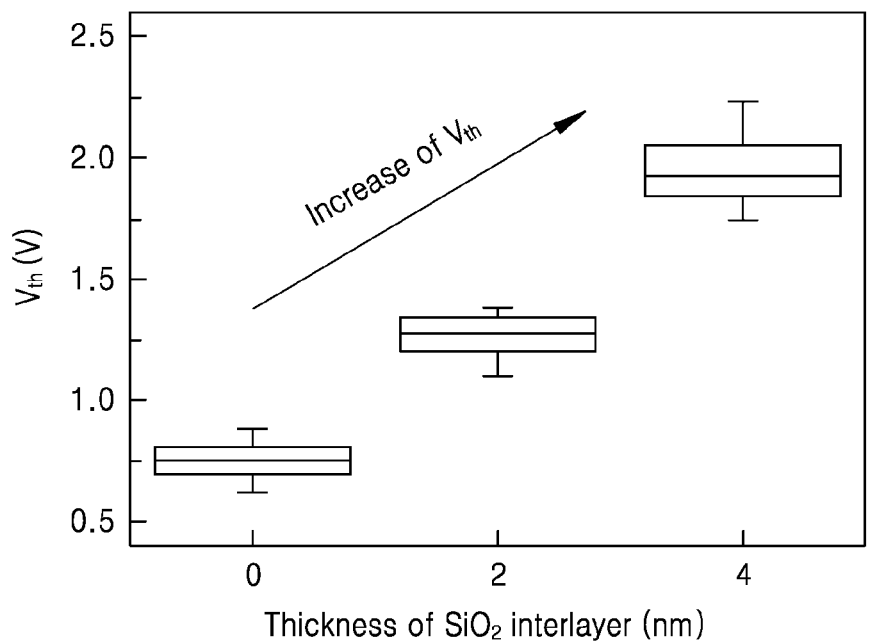

FIGS. 13A and 13B are graphs illustrating changes in electrical characteristics according to a thickness of a threshold voltage control layer of a multi-layer selector device according to an embodiment of the present invention.

Referring to FIG. 13A, current-voltage characteristics according to the thickness of the threshold voltage control layer are shown. The comparative example without the threshold voltage control layer exhibited a threshold voltage of 0.7 V. On the other hand, in the case of the embodiment, when the thickness of the threshold voltage control layer made of silicon oxide was 2 nm, the threshold voltage was 1.3 V, and when the thickness of the threshold voltage control layer was 4 nm, the threshold voltage was 2.2 V. Accordingly, it can be seen that the threshold voltage increases as the thickness of the threshold voltage control layer increases.

Referring to FIG. 13B, the threshold voltage distribution according to the thickness of the threshold voltage control layer is shown. In each case, the threshold voltage was measured from 20 repeated threshold switching operations. The comparative example without the threshold voltage control layer showed an average threshold voltage of 0.75 V. On the other hand, in the case of the embodiment, when the thickness of the threshold voltage control layer was 2 nm, the average threshold voltage was 1.27 V, and when the thickness of the threshold voltage control layer was 4 nm, the average threshold voltage was 1.95 V.

From the above results, the threshold voltage of the multi-layer selector device can be increased by inserting the threshold voltage control layer composed of silicon oxide between the conductive filament forming layer composed of zinc oxide and the lower electrode layer, and the magnitude of the threshold voltage may be controlled by controlling the thickness of the threshold voltage control layer.

When the silicon oxide layer constituting the threshold voltage control layer is formed using an atomic layer deposition method, it has a low density of defects. Silver ions may move through the defects. Therefore, in order to form a conductive filament by moving silver ions from the metal doped layer composed of silver-doped zinc oxide to the lower electrode layer through the threshold voltage control layer, a high voltage is required because the movement of silver ions in the threshold voltage control layer is difficult. Accordingly, when a threshold voltage control layer is inserted into the electrochemical metallization-based multi-layer selector device, the threshold voltage of the selector device can be controlled.

The threshold switching characteristics were measured by applying a pulse to the multi-layer selector device of the embodiment. Write pulses of 6 V and 100 µs and read pulses of 0.6 V and 50 µs were applied to the upper electrode of the selector device with a relaxation time of 10 µs. The relaxation time was defined as a time during which a rapid change in the rectification level was measured after the write pulse was applied. The on-switching time of the selector device was measured to be 6 µs. Also, the selector device returned to its initial off-state at about 10 µs time. From these results, the multi-layer selector device having the threshold voltage control layer can be stably operated using a pulse operation.

Figure 14:
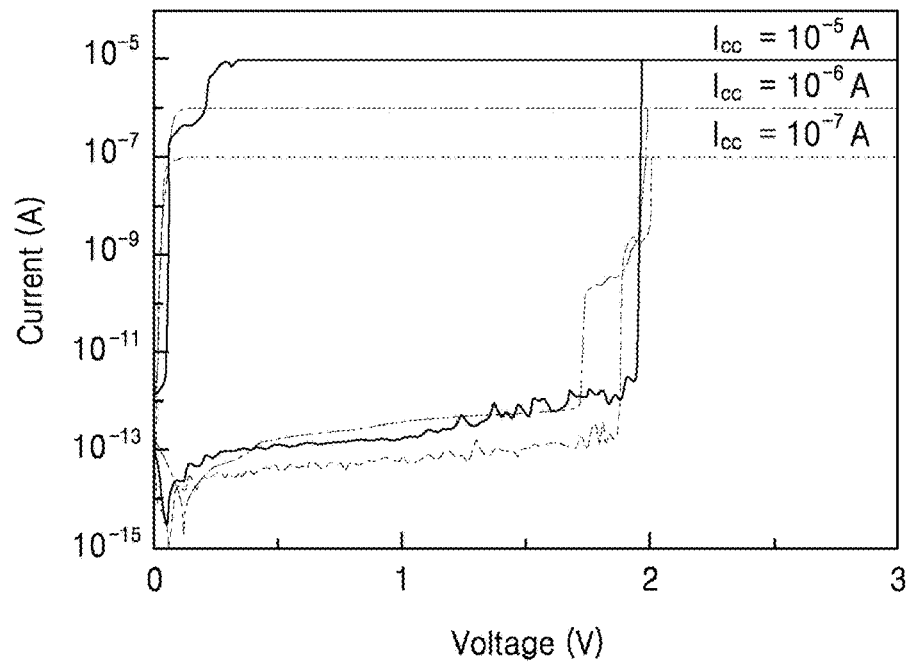
FIG. 14 is a graph illustrating current-voltage characteristics under a compliance current of a multi-layer selector device according to an embodiment of the present invention.

FIG. 14 is a graph illustrating current-voltage characteristics under a compliance current of a multi-layer selector device according to an embodiment of the present invention.

Referring to FIG. 14, the threshold switching behavior of the multi-layer selector device was measured under various compliance currents $I_{CC}$ of 0.1 µA, 1 µA, and 10 µA. The multi-layer selector device had a threshold voltage control layer with a thickness of 4 nm. Under the various compliance currents, the selector device having the silicon oxide intervening layer exhibited a low off-state current of $10^{-13}$ A, and a high threshold voltage ranging from about 1.8 V to 2 V. Accordingly, it can be seen that the multi-layer selector device has reliable threshold switching characteristics.

Figure 15:
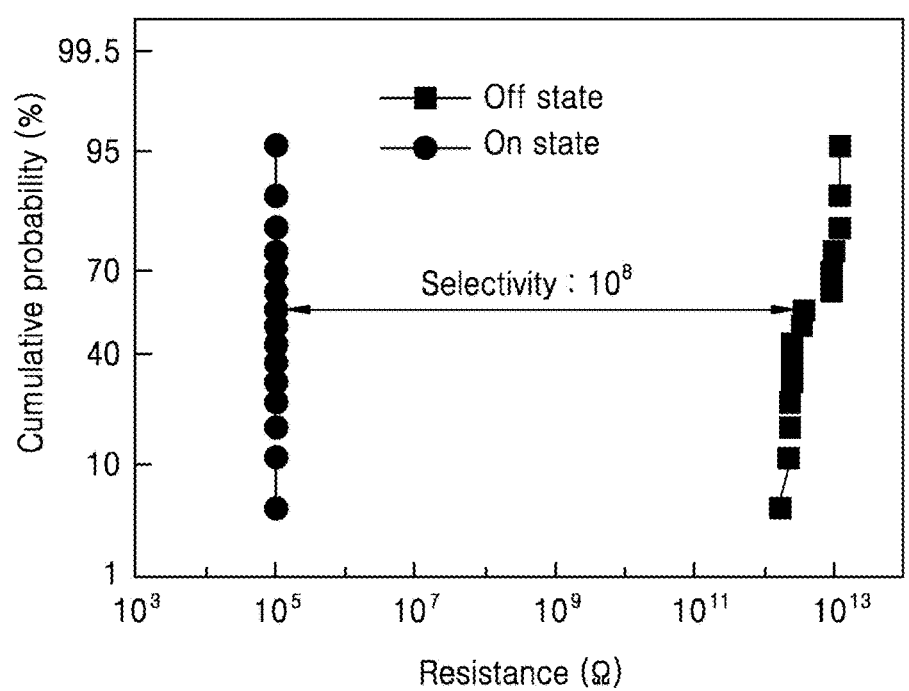
FIG. 15 is a graph illustrating cumulative probability distributions of an on-state and an off-state of a multi-layer selector device according to an embodiment of the present invention.

FIG. 15 is a graph illustrating cumulative probability distributions of an on-state and an off-state of a multi-layer selector device according to an embodiment of the present invention.

Referring to FIG. 15, the cumulative probability distribution of the on-state resistance and the off-state resistance was measured using repeated DC measurement. The multilayer selector device had a threshold voltage control layer with a thickness of 4 nm. The resistance distribution was measured during 20 repeated DC voltage operations, and the on-state resistance and off-state resistance were measured at a read voltage of 1 V. As a result, it can be seen that, for example, it has a high selectivity in the range of $10^7$ to $10^9$, for example, $10^8$, and exhibits reliable on-state resistance distribution and off-state resistance distribution.

Figure 16:
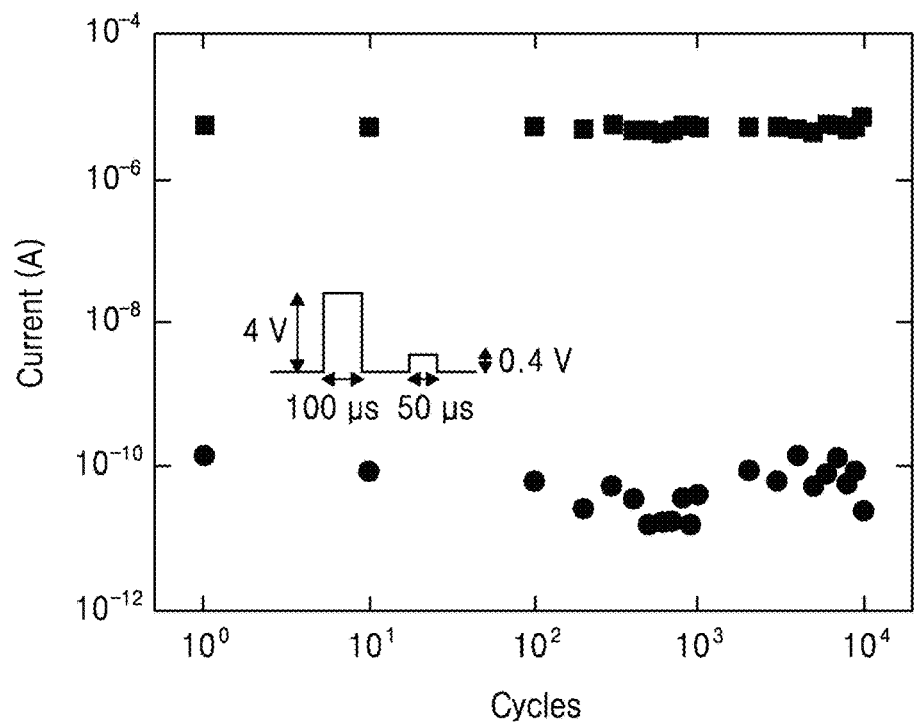
FIG. 16 is a graph illustrating endurance characteristics of a multi-layer selector device according to an embodiment of the present invention.

FIG. 16 is a graph illustrating endurance characteristics of a multi-layer selector device according to an embodiment of the present invention.

Referring to FIG. 16, in order to evaluate the stability of the selector device during repetitive operation, endurance characteristics were measured using repetitive pulse operation. The multi-layer selector device had a threshold voltage control layer with a thickness of 4 nm. A write pulse of 4 V and 100 μs and a read pulse of 0.4 V and 50 μs were repeatedly applied with a relaxation time of 100 μs between the pulses to evaluate the endurance characteristics of the multi-layer selector device. The selector device exhibited stable on-operation and off-operation for $10^4$ cycles without significant deterioration, and thus it can be seen that it has reliable threshold switching characteristics.

Figure 17:
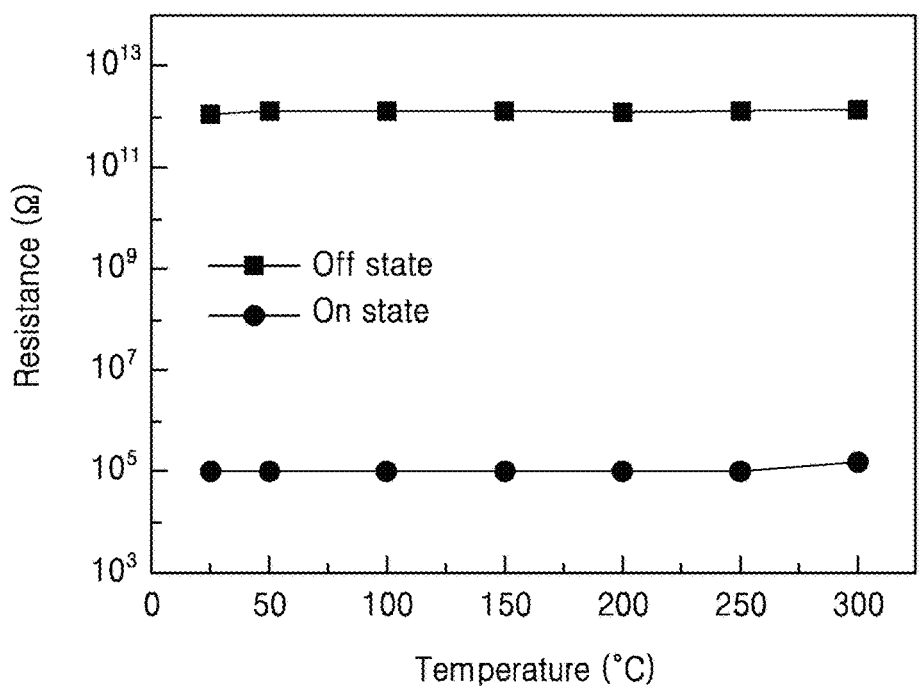
FIG. 17 is a graph illustrating thermal stability characteristics of a multi-layer selector device according to an embodiment of the present invention.

FIG. 17 is a graph illustrating thermal stability characteristics of a multi-layer selector device according to an embodiment of the present invention.

Referring to FIG. 17, the thermal stability of the multi-layer selector device was evaluated at various temperatures. The multi-layer selector device had a threshold voltage control layer with a thickness of 4 nm. The on-state resistance and the off-state resistance were measured at 1 V, respectively. The on-state resistance and off-state resistance of the multi-layer selector device were maintained up to 300° C. without significant deterioration.

From these results, the multi-layer selector device including the threshold voltage control layer made of silicon oxide can be used as a selector device for a memory device.

Figure 18A:
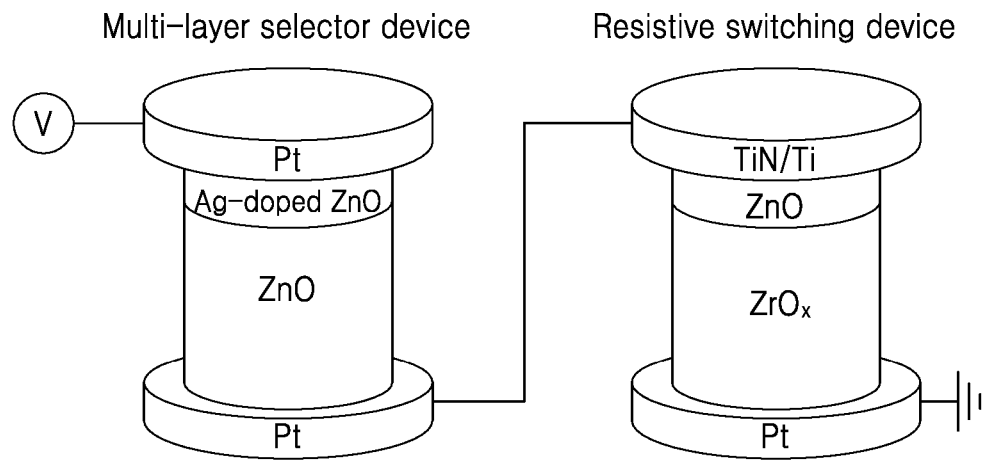
FIGS. 18A and 18B are schematic diagrams of a 1S-1R device in which a multi-layer selector device and a resistive switching memory device are combined according to an embodiment of the present invention.

FIGS. 18A and 18 B are schematic diagrams of a 1S-1R device in which a multi-layer selector device and a resistive switching memory device are combined according to an embodiment of the present invention.

FIG. 18A is a case in which a 1S-1R device is configured as a multi-layer selector device that does not include a threshold voltage control layer as a comparative example.

Figure 18B:
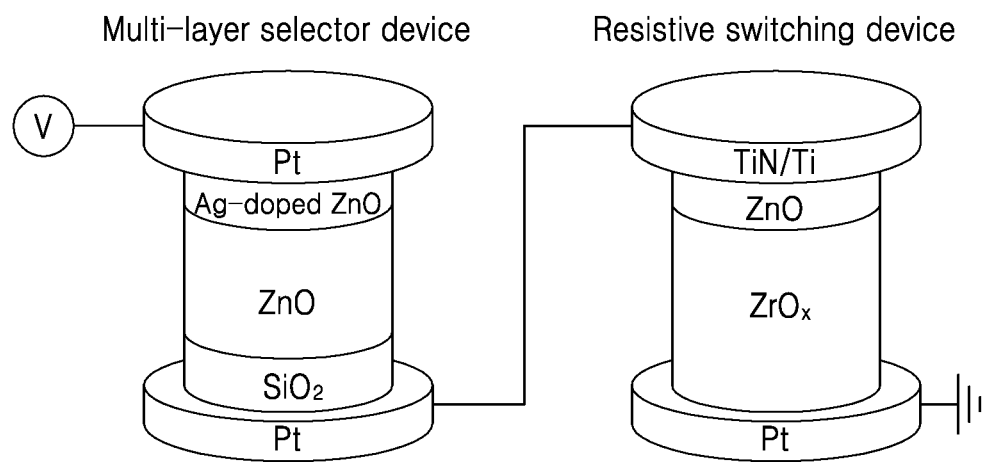

FIG. 18B is a case in which the 1S-1R device is configured as a multi-layer selector device including a threshold voltage control layer made of silicon oxide having a thickness of 4 nm as an embodiment.

Referring to FIGS. 18A and 18B, with this combination, compatibility between the multi-layer selector device and the resistive switching memory device can be confirmed. The resistive switching memory device has a TiN/Ti/ZnO/ZrOx/Pt structure. The resistive switching memory device includes a lower electrode made of platinum Pt, a memory layer made of ZrOx and titanium Ti, and an upper electrode made of titanium nitride TiN. The lower electrode of the multi-layer selector device and the upper electrode of the resistive switching memory device are electrically connected to each other. A voltage is applied to the upper electrode of the multi-layer selector device, and the lower electrode of the resistive switching memory device is grounded. The resistive switching memory device exhibited resistive switching characteristics at a set voltage $V_{set}$ of 2.8 V.

Figure 19A:
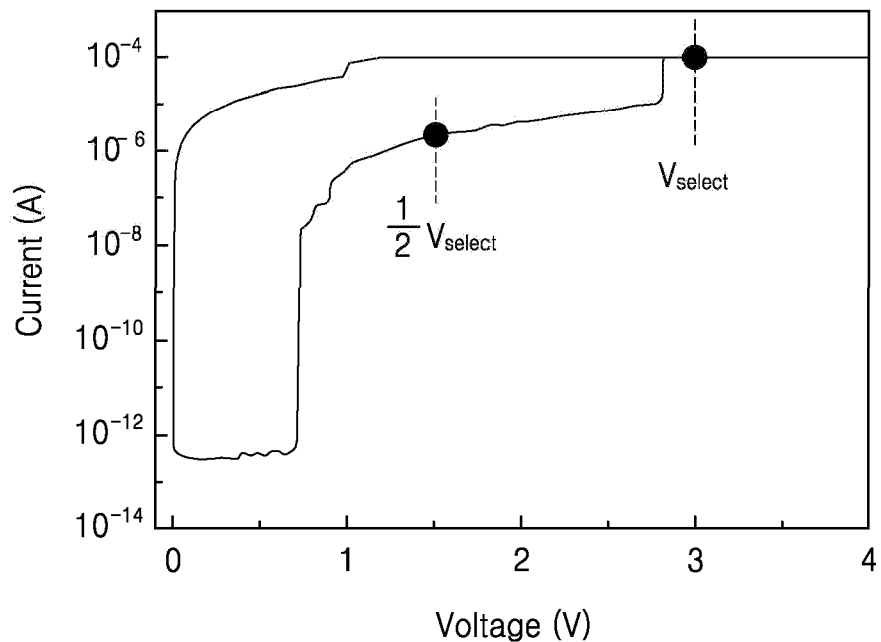
FIGS. 19A and 19B are graphs illustrating current-voltage characteristics of a 1S-1R device in which a multi-layer selector device and a resistive switching memory device are combined according to an embodiment of the present invention.
Figure 19B:
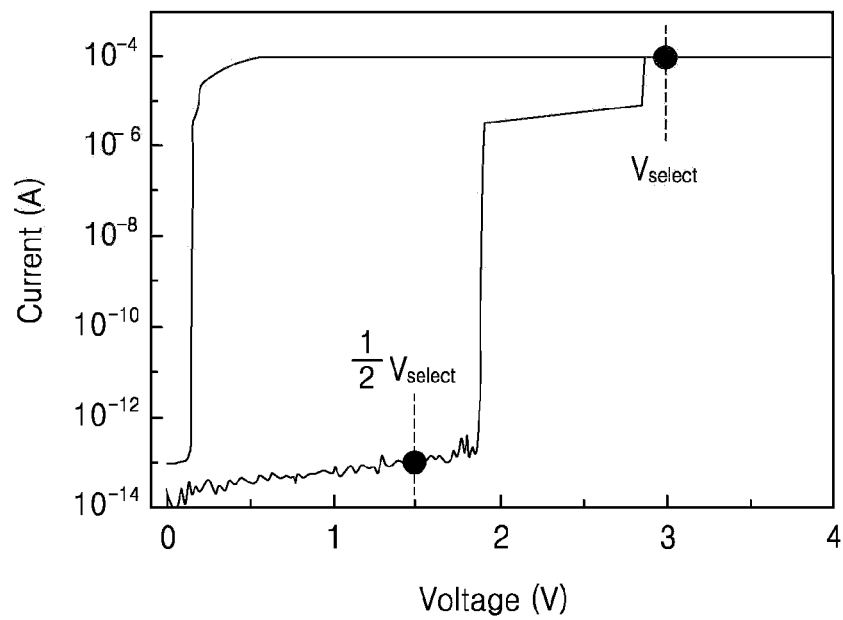

FIGS. 19A and 19B are graphs illustrating current-voltage characteristics of a 1 S-1R device in which a multi-layer selector device and a resistive switching memory device are combined according to an embodiment of the present invention.

Referring to FIG. 19A, as a comparative example, a 1S-1R device is configured as a multi-layer selector device that does not include a threshold voltage control layer. In the case of the comparative example, when a voltage was applied, the multi-layer selector device performed a switching operation at a threshold voltage of 0.7 V, and the resistive switching memory device performed a set operation at 2.8 V. Since the threshold voltage $V_{th}$ of the multi-layer selector device 1S is smaller than the ½ selection voltage ½$V_{select}$, the unselected multi-layer selector device may be in an on-state during a write operation. Accordingly, a large leakage current may appear.

Referring to FIG. 19B, as an embodiment, a 1S-1R device is configured as a multi-layer selector device including a threshold voltage control layer made of silicon oxide having a thickness of 4 nm. In the embodiment, when a voltage is applied, the multilayer selector device performs a switching operation at a threshold voltage of 1.9 V, and the resistive switching memory device performs a set operation at 2.8 V. Since the threshold voltage $V_{th}$ of the multi-layer selector device 1S is greater than the ½ selection voltage ½$V_{select}$, the unselected multi-layer selector device may be turned off during a write operation. Accordingly, the leakage current may appear small.

Figure 20A:
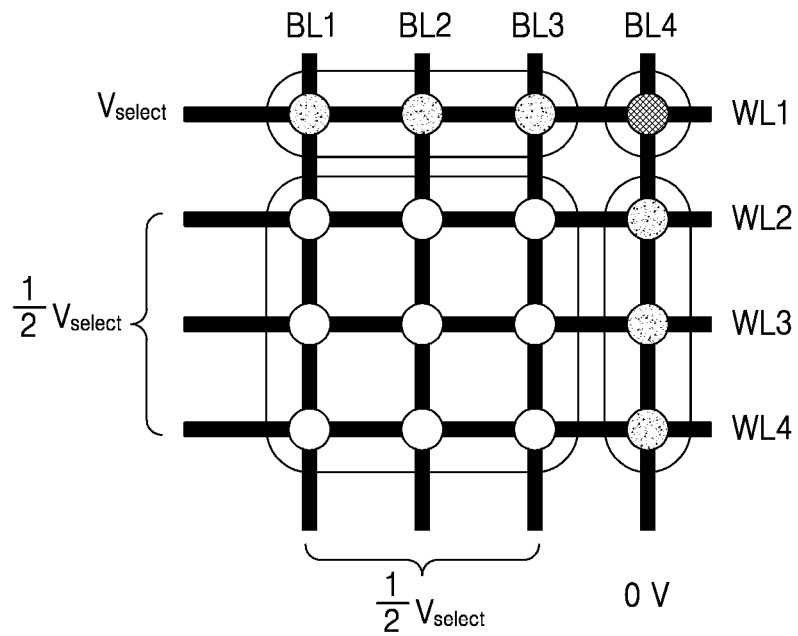
FIGS. 20A and 20B are schematic diagrams of a cross-point array device formed using a 1S-1R device in which a multi-layer selector device and a resistive switching memory device are combined according to an embodiment of the present invention.
Figure 20B:
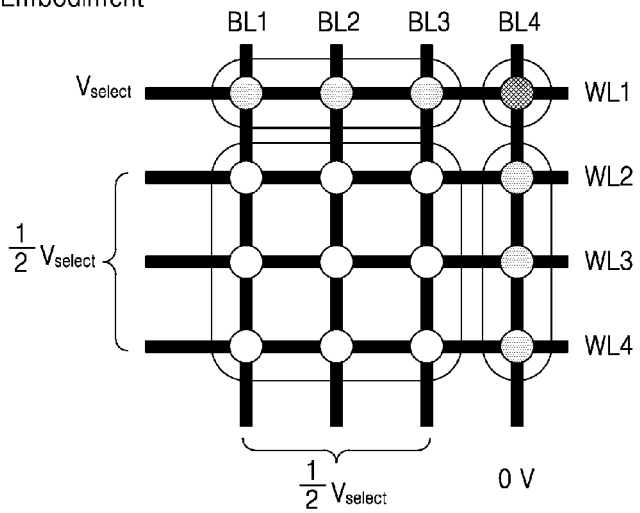

FIGS. 20A and 20B are schematic diagrams of a cross-point array device formed using a 1S-1R device in which a multi-layer selector device and a resistive switching memory device are combined according to an embodiment of the present invention.

In FIG. 20A is a case in which a 1S-1R device is configured as a multi-layer selector device that does not include a threshold voltage control layer as a comparative example. FIG. 20B is a case in which the 1S-1R device is configured as a multi-layer selector device including a threshold voltage control layer made of silicon oxide having a thickness of 4 nm as an embodiment.

Referring to FIGS. 20A and 20B, in the write operation of the 1S-1R device, the selection voltage $V_{select}$ is required to be greater than the set voltage $V_{set}$. When the 1S-1R devices constitute a cross-point array memory, a difference in leakage current may occur. A ½ select voltage ½$V_{select}$ may be used to operate the 1S-1R cross point array memory.

That is, the write select voltage $V_{select}$ is applied to the word line 1 WL1, the bit line 4 BL4 is grounded, and the ½ select voltage ½$V_{select}$ is applied to unselected word lines and bit lines. In this case, a leakage current may occur in unselected cells located on the selected word line 1 WL1 and bit line 4 BL4.

As in the embodiment, when the selector device has a high threshold voltage, the leakage current at the ½ selection voltage ½$V_{select}$ may be expressed as low as $10^{-13}$ A. However, when the selector device has a low threshold voltage as in the comparative example, the leakage current at the ½ selection voltage ½$V_{select}$ is increased to $10^{-6}$ A. Also, it may cause a sensing error in other adjacent cells. Therefore, in order to reduce the leakage current of the resistive switching memory device in the cross-point array memory, it is necessary to increase the threshold voltage of the electrochemical metallization-based selector device. From the above results, the threshold voltage control layer made of silicon oxide may affect the threshold voltage and switching characteristics of the multi-layer selector device.

As described above, an electrochemical metallization-based threshold switching multi-layer selector device into which a threshold voltage control layer made of silicon oxide is inserted was manufactured using sputtering and atomic layer deposition. The silicon oxide was formed using an atomic layer deposition method.

The fabricated multi-layer selector device had a selectivity of $10^8$ and a controllable threshold voltage characteristic in the range of 0.6 V to 2.2 V by controlling the thickness of the silicon oxide constituting the threshold voltage control layer. By inserting the threshold voltage control layer, a controllable threshold voltage characteristic of the multi-layer selector device is realized. The multi-layer selector device exhibited reliable threshold switching characteristics during AC operation up to $10^4$ cycles. In addition, the thermal stability of the multi-layer selector device was maintained up to a temperature of 300° C. without significant deterioration.

By connecting the multi-layer selector device and the resistive switching memory device, the leakage current of the memory device was compared at a ½ selection voltage ½$V_{select}$ depending on selector devices having different threshold voltages. When a threshold voltage control layer is inserted into the multi-layer selector device, the threshold voltage of the multi-layer selector device is induced to be higher than the set voltage of the resistive switching memory device, and the leakage current of the memory cell can be controlled to decrease to $10^{-6}$ A to $10^{-13}$ A.

From these results, an electrochemical metallization-based threshold switching multi-layer selector device with a wide range of controllable threshold voltages can be applied to a high-density cross-point array memory. In addition, it is possible to implement a multi-layer selector device having a controllable threshold voltage characteristic by controlling the thickness of silicon oxide constituting the threshold voltage control layer, and by using the multi-layer selector device, it is possible to effectively reduce the leakage current of the high-density cross-point array memory.

Figure 21:
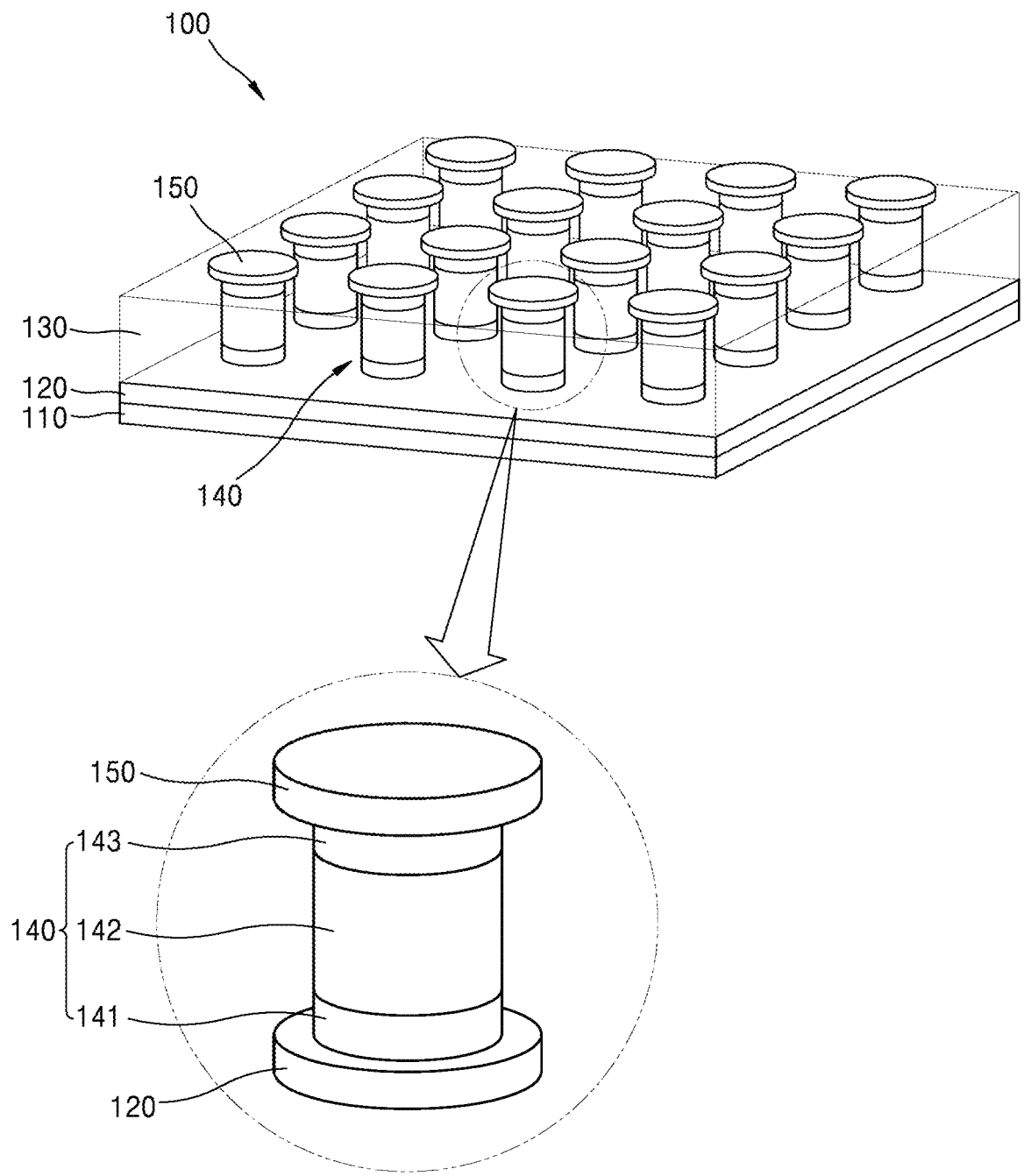
FIG. 21 is a schematic diagram illustrating a multi-layer selector device 100 according to another embodiment of the present invention.

FIG. 21 is a schematic diagram illustrating a multi-layer selector device 100 according to another embodiment of the present invention. The multi-layer selector device 100 according to this embodiment has some configuration modified or changed from the multi-layer selector device 100 of FIG. 2, and may be referred to each other, and thus duplicated descriptions will be omitted.

Referring to FIG. 21, the multi-layer selector device 100 includes a substrate 110, a lower electrode layer 120, an insulating layer 130, a switching layer 140, and an upper electrode layer 150.

Specifically, the multi-layer selector device 100 includes a substrate 110, a lower electrode layer 120 disposed on the substrate; an insulating layer 130 disposed on the lower electrode layer and having a via hole passing through to expose the lower electrode layer; a switching layer 140 disposed on the lower electrode layer in the via hole, performing a switching operation by forming and destroying a conductive filament, and having a doping concentration gradient of a metal forming the conductive filament 140; and an upper electrode layer 150 disposed on the switching layer.

The switching layer 140 may include a first metal doped layer 141, a conductive filament forming layer 142, and a second metal doped layer 143. For example, the switching layer 140 may include a first metal doped layer 141 disposed on the lower electrode layer and doped with a metal forming the conductive filament; a conductive filament-forming layer 142 located on the first metal doped layer, in which the conductive filament is formed or destroyed by the metal; and a doped second metal doped layer 143 disposed on the conductive filament-forming layer and doped with a metal forming the conductive filament.

For the first metal doped layer 141 and the second metal doped layer 143, reference may be made to the description of the metal doping 160 of FIG. 2. The first metal doped layer 141 and the second metal doped layer 143 may be doped with the same metal or doped with different metals. In addition, insulating materials constituting each of the first metal doped layer 141, the conductive filament forming layer 142, and the second metal doped layer 143 may be the same or different from each other.

The conductive filament forming layer 142 may refer to the conductive filament forming layer 170 of FIG. 2.

The first metal doped layer 141, the conductive filament forming layer 142, and the second metal doped layer 143 constituting the switching layer 140 may have different metal doping concentrations.

The first metal doped layer 141 and the second metal doped layer 143 may have a first metal doping concentration, and the conductive filament forming layer 142 may have a second metal doping concentration lower than the first metal doping concentration.

In addition, the first metal doped layer 141 and the second metal doped layer 143 may have a first metal doping concentration, and the conductive filament forming layer 142 may be undoped with a metal.

Alternatively, on the contrary, the conductive filament forming layer 142 has a first metal doping concentration, and the first metal doped layer 141 and the second metal doped layer 143 have a second metal doping concentration lower than the first metal doping concentration in the some embodiments of the present invention.

Also, the metal doping concentrations of the first metal doped layer 141 and the second metal doped layer 143 may be the same or different from each other.

The doping concentration of the first metal and the doping concentration of the second metal may be different depending on a base material and a doped metal. For example, when the matrix material is zinc oxide and the metal to be doped is silver, the first metal doping concentration may be, for example, in the range of 0.01% to 50%, and the second metal doping concentration is, For example, it may range from 0.01% to 50%.

Figure 22:
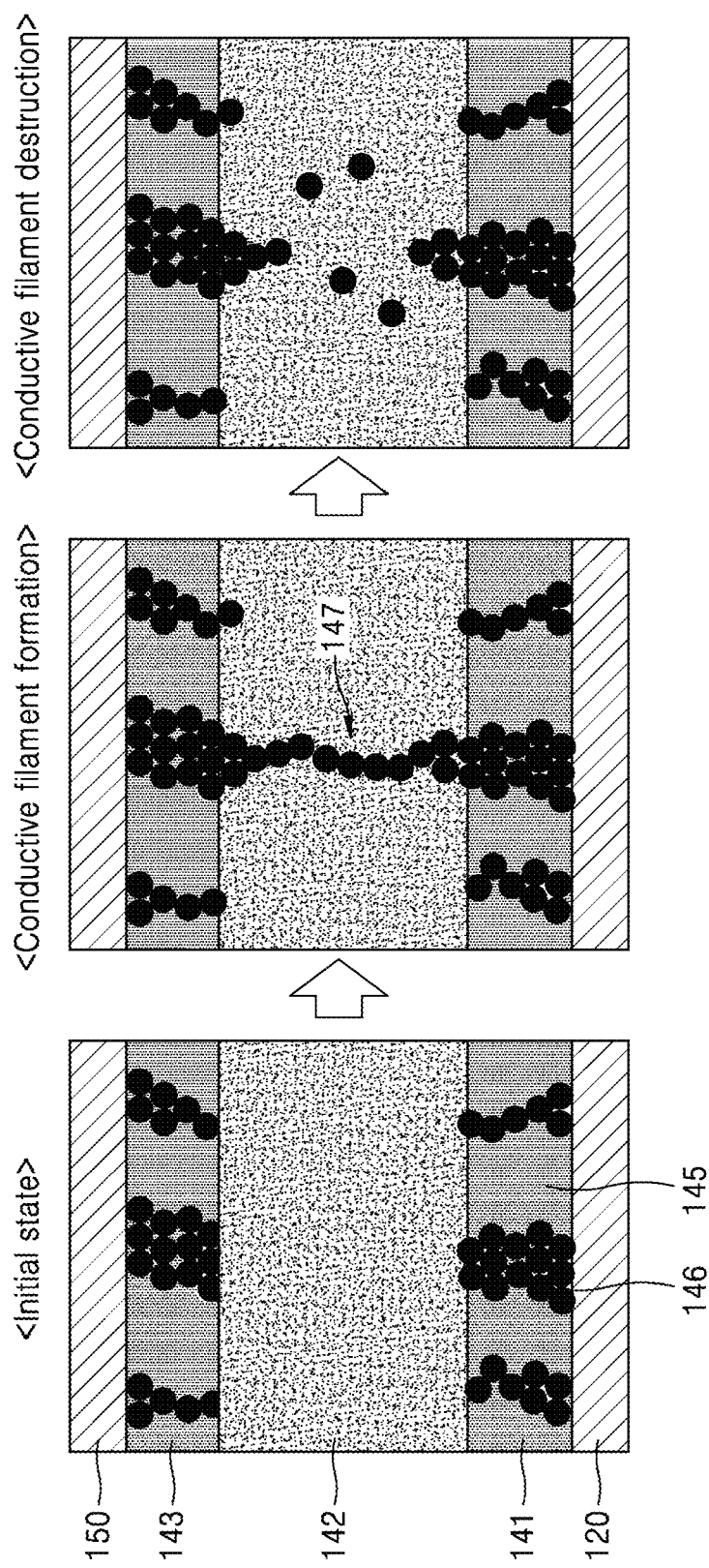
FIG. 22 is a schematic diagram illustrating the formation and destruction of conductive filaments in the multi-layer selector device of FIG. 21.

FIG. 22 is a schematic diagram illustrating the formation and destruction of conductive filaments in the multi-layer selector device of FIG. 21.

Referring to FIG. 22, in an initial state, the first metal doped layer 141 and the second metal doped layer 143 may exist by doping the insulator matrix 145 with the metal 146. On the other hand, the conductive filament forming layer 142 may not be doped with the metal or may be doped to a level that does not form the conductive filament 147.

Subsequently, when an external electrical signal is applied to the lower electrode layer 120 and the upper electrode layer 150, the doped metal of the first metal doped layer 141 and the second metal doped layer 143 may move to the conductive filament forming layer 142 to form a conductive filament 147. When the metal moves, the metal may move in an atomic state or in a cation state. By forming the conductive filament 147, the lower electrode layer 120 and the upper electrode layer 150 may be electrically connected. Specifically, the lower electrode layer 120, the metal 146 doped in the first metal doped layer 141, the conductive filament 147, the metal 146 doped in the second metal doped layer 143, and the upper electrode layer 150 may be physically connected to form an electrical path.

Subsequently, when an electrical signal applied from the outside is removed, the conductive filament 147 may be destroyed, and the metal constituting the conductive filament 147 can be moved again to the first metal doped layer 141 or the second metal doped layer 143. Accordingly, the conductive filament 147 may have volatile properties. However, this is an example, and a case in which the conductive filament 147 has non-volatile properties is also included in the technical spirit of the present invention.

In some embodiments, the forming of the switching layer 140 may be formed to have a gradient in the doping concentration of the metal by using co-sputtering using an oxide target and a metal target together.

Figure 23A:
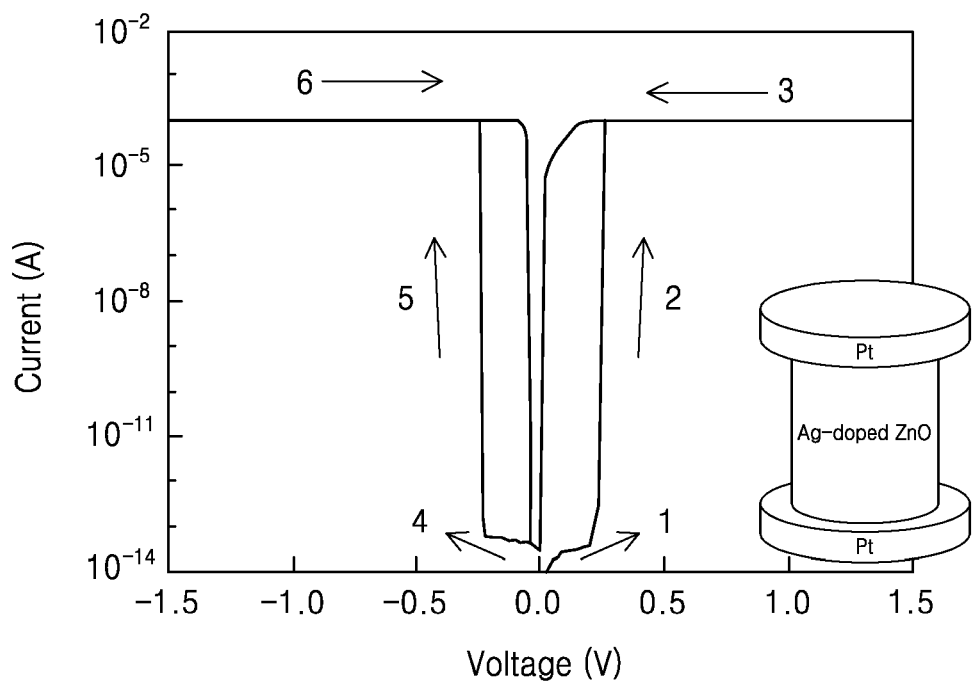
FIGS. 23A and 23B are graphs illustrating a comparison of current-voltage characteristics of the multi-layer selector device and the single-layer selector device of FIG. 21.
Figure 23B:
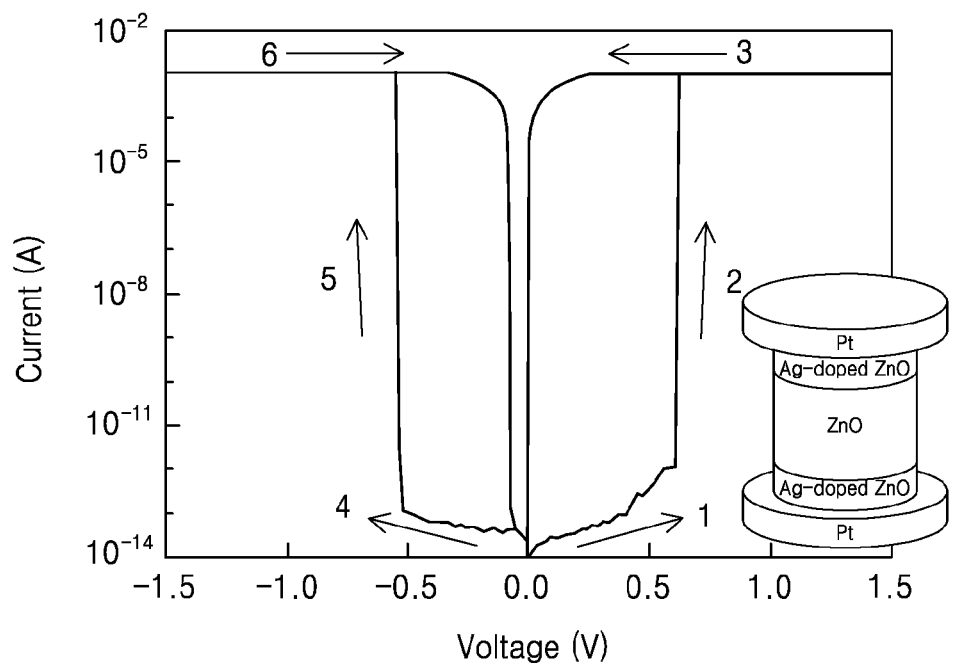

FIGS. 23A and 23B are graphs illustrating a comparison of current-voltage characteristics of the multi-layer selector device and the single-layer selector device of FIG. 21.

Referring to FIG. 23A, a current-voltage characteristic under a compliance current $I_{cc}$ of 100 μA is shown for the Pt/AZO/Pt structure as a comparative example. In the case of the single layer selector device of the comparative example, a bidirectional volatile threshold switching characteristic was exhibited at a compliance current of 100 μA. However, the compliance current was increased to exhibit resistive switching memory characteristics in the case of 1 mA. When the compliance current is increased, silver ions in the silver-doped zinc oxide layer become excess, and thus the excess silver ions form non-volatile conductive filaments. In order to break the non-volatile conductive filament, a negative bias is required to induce Joule heating of the current.

In order to suppress the formation of the non-volatile conductive filaments, a multi-layer structure such as AZO/ZnO/AZO may be proposed. The reason is that, in the multi-layer structure, the silver-undoped zinc oxide layer interposed between the silver-doped zinc oxide layers may prevent excessive inflow of silver ions, thereby suppressing the formation of nonvolatile conductive filaments.

Referring to FIG. 23B, a current-voltage characteristic under a compliance current of 1 mA for the Pt/AZO/ZnO/AZO/Pt structure as an embodiment is shown. In the case of the multi-layer selector device of the embodiment, the volatile threshold switching characteristic was exhibited even at a relatively high compliance current. In addition, at voltages of 0.62 V and −0.53 V, the off current $I_{off}$ changed rapidly from the off current $I_{off}$ to the compliance current.

It can be seen that the multi-layer selector device has, for example, a high selectivity of $10^{10}$, a high on-current density of 2 MA cm$^{-2}$, and a low off-current $I_{off}$ of $10^{-13}$ A. In addition, it is known that the multi-layer selector device has a high selectivity of $10^9$ to $10^{11}$, a high on-current density of 1 MA cm$^{-2}$ to 20 MA cm$^{-2}$, and a low off-current $I_{off}$ of $10^{-15}$ A to $10^{-12}$ A.

Hereinafter, threshold switching characteristics of the multi-layer selector device will be described.

The threshold switching characteristic may be provided by the formation and destruction of conductive filaments through a solid electrolyte layer such as ZnO. In the silver-undoped zinc oxide layer, when silver ions have a large diffusion coefficient and the migration barrier of zinc Zn vacancies is small, silver ions in the silver-doped zinc oxide layers pass through the zinc vacancies by an electric field. It can be easily diffused into the silver-undoped zinc oxide layer. When a voltage is applied to the multi-layer selector device, silver ions included in the silver-doped zinc oxide layer diffuse through the silver-doped zinc oxide layer, so that silver atoms on the surface of the upper electrode or the lower electrode are reduced.

The silver atoms may form a conductive filament electrically connected to the upper electrode and the lower electrode. In this process, the formed conductive filament has non-volatile properties or volatile properties, depending on the amount of silver present in the silver-undoped zinc oxide layer. For example, when the amount of silver is large, the conductive filament has non-volatile properties. Therefore, it is possible to limit the amount of silver ions diffused into the silver-undoped zinc oxide layer by controlling the silver doping concentration of the silver-doped zinc oxide layer, and accordingly, the volatile conductive filaments can be induced to be formed in the silver-undoped zinc oxide layer.

When the volatile conductive filaments are formed at the threshold voltage $V_{th}$, the volatile conductive filaments are maintained while the electric field is maintained, and a current may flow between the upper electrode and the lower electrode. The volatile conductive filaments have a tendency to be decomposed into nanoparticles to reduce surface energy, and thus may have a nano size and a cylindrical shape. When the electric field is removed, according to a Rayleigh instability effect, silver atoms constituting the volatile conductive filament are ionized into silver ions to reduce surface energy, and thus the volatile conductive filament is decomposed. Accordingly, the multi-layer selector device returns to the current level of the initial off current loll state.

Figure 24:
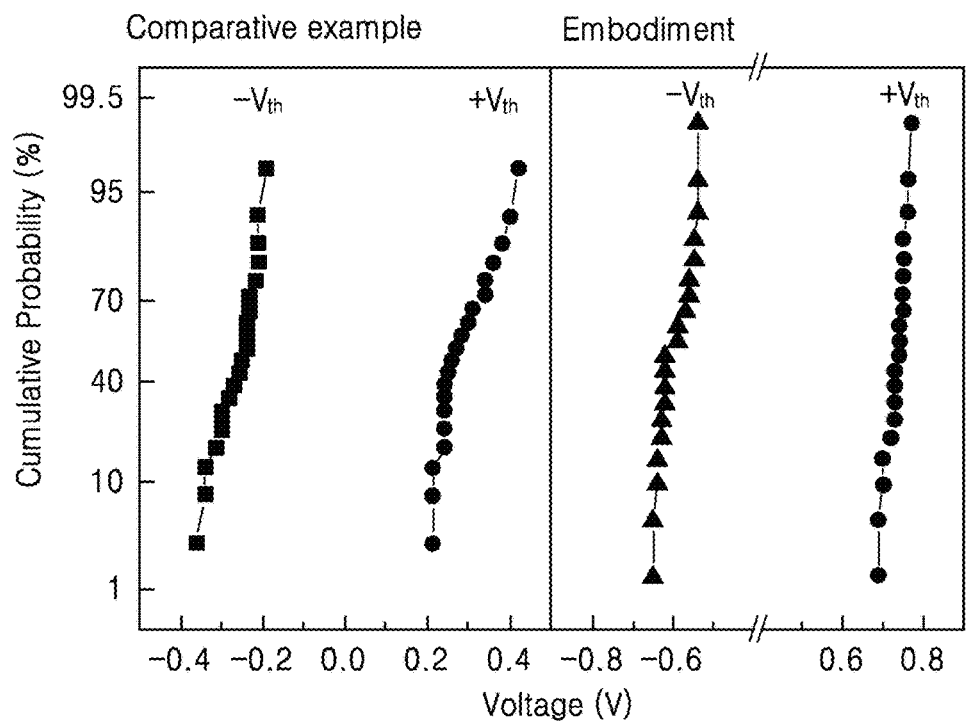
FIG. 24 is a graph illustrating a comparison of cumulative probability distributions of threshold voltages of the multi-layer selector device and the single-layer selector device of FIG. 21.

FIG. 24 is a graph illustrating a comparison of cumulative probability distributions of threshold voltages of the multi-layer selector device and the single-layer selector device of FIG. 21.

Referring to FIG. 24, cumulative probability distributions of threshold voltages $V_{th}$ for 20 single-layer selector devices of comparative examples and multi-layer selector devices of embodiments are shown. In the case of the comparative example, the positive threshold voltage was an average of 0.29 V, the standard deviation was 0.07 V, the negative threshold voltage was the average of −0.26 V, and the standard deviation was 0.05 V. In the case of the embodiment, the positive threshold voltage was an average of 0.73 V, the standard deviation was 0.02 V, the negative threshold voltage was the average of −0.59 V, and the standard deviation was 0.04 V. In the case of embodiments, the absolute value of the mean was larger and the standard deviation was smaller. Therefore, it is analyzed that the multilayer selector device of the embodiment has higher reliability.

Figure 25:
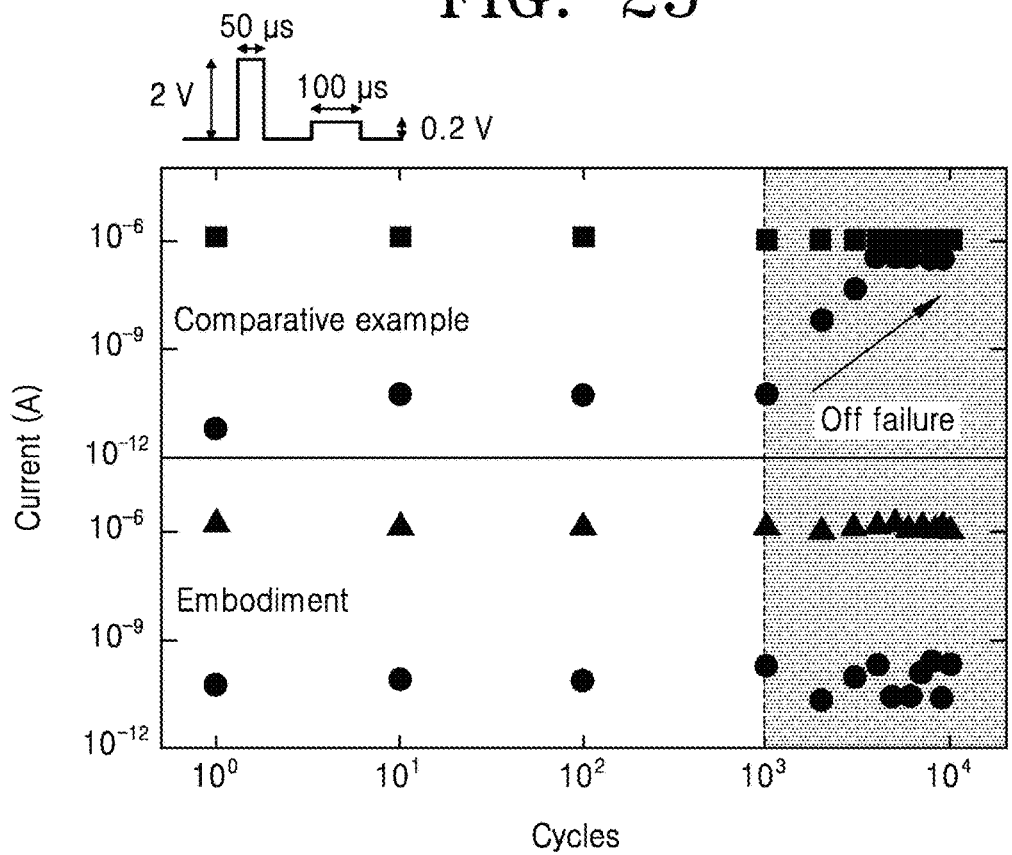
FIG. 25 is a graph illustrating endurance characteristics of the multi-layer selector device and the single-layer selector device of FIG. 21 by comparison.

FIG. 25 is a graph illustrating endurance characteristics of the multi-layer selector device and the single-layer selector device of FIG. 21 by comparison.

Referring to FIG. 25, by repeatedly applying a program pulse of 2 V and 50 μs and a read pulse of 0.2 V and 100 μs with a relaxation time of 100 μs between the pulses, the endurance characteristics of the multi-layer selector device are evaluated. In the case of the comparative example, off-failure was shown after $10^3$ cycles. On the other hand, in the case of the embodiment, no significant deterioration was observed, and it showed stable on-operation and off-operation even at $10^4$ cycles or more cycles after destruction of the comparative example.

When a voltage is applied to a single layer selector device using an electrochemical metallization phenomenon, conductive filaments may be randomly formed in the switching layer. Random growth of these conductive filaments may reduce the reliability and endurance of the single layer selector device. However, in the multi-layer selector device, since silver ions forming conductive filaments in the silver-undoped zinc oxide layer are scarce, this tendency of random formation can be relatively reduced. Therefore, it is analyzed that the multi-layer selector device of the embodiment has improved reliability characteristics and endurance characteristics. It is analyzed that the multi-layer selector device provides stable operation at an operating speed of 180 ns.

Figure 26A:
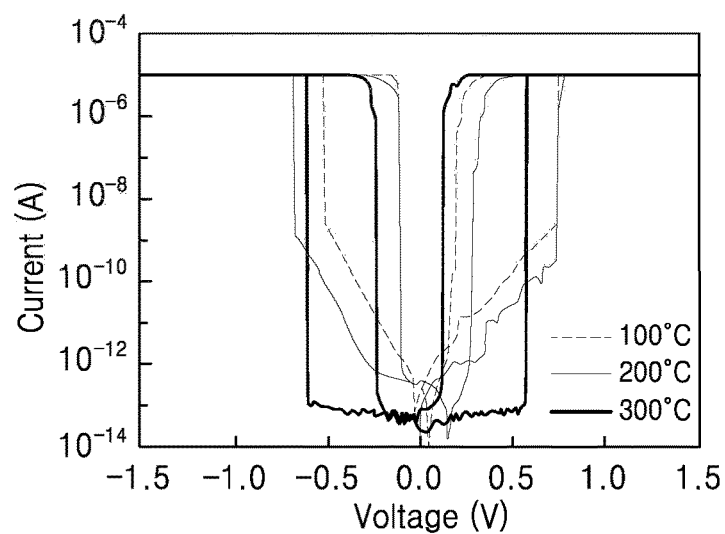
FIGS. 26A, 26B and 26C are graphs showing the effect of annealing temperature of the multi-layer selector device of FIG. 21.
Figure 26B:
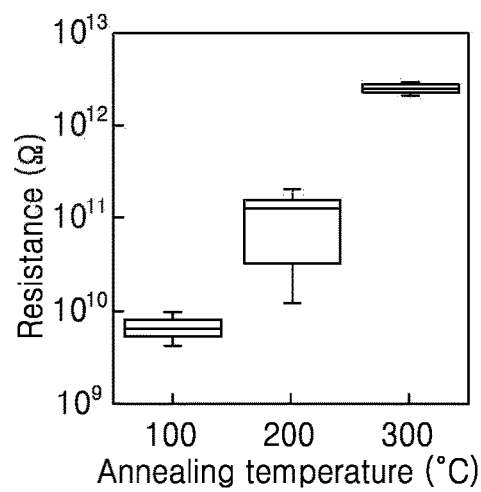
Figure 26C:
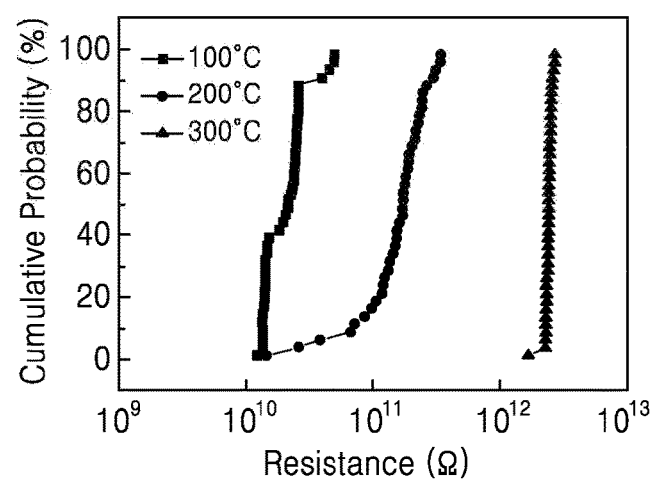

FIGS. 26A, 26B, and 26C are graphs showing the effect of annealing temperature of the multi-layer selector device of FIG. 21.

Referring to FIG. 26A, the current-voltage characteristics according to the annealing temperature of the multi-layer selector device are shown. When the annealing temperature was 100° C., it exhibited a threshold switching characteristic having an off current of $1.7 \times 10^{-11}$ A level, when the annealing temperature is 200° C., it exhibited threshold switching characteristics having an off current of $1.0 \times 10^{-12}$ A level, and when the annealing temperature was 300° C., it exhibited threshold switching characteristics having a relatively low off current of $1.0 \times 10^{-13}$ A level. It can be seen that as the annealing temperature increases, the off-state current of the multi-layer selector device decreases. Therefore, it was analyzed that the threshold switching characteristics of the multi-layer selector device were significantly affected by the annealing temperatures. Preferably, the annealing temperature is about 300° C.

Referring to FIG. 26B, the off-state resistance $R_{off}$ according to the annealing temperature of the multilayer selector device is shown. The off-state resistance was measured at a voltage of 0.3 V for 20 devices.

When the annealing temperature was 100° C., an off-state resistance of $6.5 \times 10^9$ was exhibited, and when the annealing temperature was 200° C., an off-state resistance of $10^{11} \Omega$ was exhibited, and the annealing temperature was At 300° C., a relatively high off-state resistance of $2 \times 10^{12} \Omega$ was exhibited. It can be seen that the off-state resistance of the multi-layer selector device increases as the annealing temperature increases. Therefore, it was analyzed that the off-state resistance of the multi-layer selector device was significantly affected by the annealing temperatures.

Referring to FIG. 26C, the cumulative probability distribution of the off-state resistance according to the annealing temperature of the multi-layer selector device is shown. The off-state resistance was measured at a voltage of 0.3 V for 40 consecutive operating cycles. Compared to other annealing temperatures, the variation in off-state resistance was small when the annealing temperature was 300° C. It is analyzed that this characteristic can be induced as the crystallinity of the zinc oxide layer increases by the annealing. In the case where the annealing temperature is 300° C., silver ions may easily migrate by increasing the crystallinity of the zinc oxide layer, and defects of zinc oxide that may form conductive filaments may be reduced. After the conductive filament is generated once, the formation and destruction of the conductive filament in the weakest part of the conductive filament occur repeatedly, so the threshold voltage $V_{th}$ of the multi-layer selector device does not show a significant change. From these results, annealing at 300° C. can effectively reduce the variance of the off-current $I_{off}$ and the off-resistance $R_{off}$ of the multi-layer selector device.

As described above, a multi-layer selector device having a Pt/AZO/ZnO/AZO/Pt structure doped with silver at various concentrations was prepared. In order to deposit uniform thin films by a CMOS-compatible process, a multi-layer selector device was manufactured using a sputtering method. By controlling the doping concentration of silver in the silver-doped zinc oxide layer, the formation of conductive filaments was controlled, and a high ion density of 2 MA cm$^{-2}$ was achieved. After annealing at 300° C., the device had a low off current $I_{off}$ of $10^{-13}$ A.

In addition, the selector device to which the multi-layer structure is applied has increased ion density and endurance compared to the selector device having a single layer structure. In addition, it was possible to change the threshold voltage characteristics of the selector device by controlling the thickness of the undoped zinc oxide layer. The multi-layer selector device exhibited a bidirectional threshold switching characteristic having a high selectivity of $10^{10}$, a low off-current of $10^{-13}$ A, and a high ion density of 2 MA cm$^{-2}$. In addition, the multi-layer selector device exhibited a switching time of 180 ns in a pulsed operation.

When the multi-layer selector device was connected to a ZrOx-based resistive switching memory to form a 1S-1R device, the leakage current was significantly suppressed to a level of $2 \times 10^{-13}$ A, and stable set/reset behavior was exhibited during pulse operations. Therefore, multi-layer selector devices with controlled silver-doped layers can be applied to high-density cross-point memory devices.

The technical spirit of the present invention described above is not limited to the above-described embodiments and the accompanying drawings, and it will be apparent to those of ordinary skill in the art to which this belongs that various substitutions, modifications and changes are possible within the scope without departing from the technical spirit of the present invention.

The invention claimed is:

1. A multi-layer selector device, comprising:
   a substrate;
   a lower electrode layer disposed on the substrate;
   a switching layer disposed on the lower electrode layer, configured for performing a switching operation by forming and destroying a conductive filament, and made of a multi-layer to control the formation of the conductive filament; and
   an upper electrode layer disposed on the switching layer, wherein the switching layer comprises:
   a first threshold voltage control layer, a conductive filament forming layer, a metal doped layer, and a second threshold voltage control layer, respectively disposed on the lower electrode layer.

2. The multi-layer selector device of claim 1, wherein in the switching layer,
   the first threshold voltage control layer is disposed on the lower electrode layer,
   the conductive filament forming layer is disposed on the first threshold voltage control layer,
   the metal doped layer is disposed on the conductive filament forming layer, and
   the second threshold voltage control layer is disposed on the metal doped layer.

3. The multi-layer selector device of claim 1, wherein in the switching layer,
   the first threshold voltage control layer is disposed on the lower electrode layer,
   the metal doping layer is disposed on the first threshold voltage control layer,
   the conductive filament forming layer is disposed on the metal doped layer, and
   the second threshold voltage control layer is disposed on the conductive filament forming layer.

4. The multi-layer selector device of claim 1, wherein the conductive filament forming layer or the metal doped layer comprises at least one of zinc oxide, indium oxide, indium-zinc oxide, indium-gallium oxide, zinc-tin oxide, aluminum-zinc oxide, gallium-zinc oxide, indium-zinc-tin oxide, indium-gallium-zinc oxide, indium-gallium-tin oxide, hafnium oxide, hafnium-zirconium oxide, zirconium oxide, tantalum oxide, titanium oxide, tungsten oxide, manganese oxide, nickel oxide, and magnesium oxide.

5. The multi-layer selector device of claim 1, further comprising:
an adhesive layer interposed between the substrate and the lower electrode layer to bond the substrate and the lower electrode layer to each other.

6. A multi-layer selector device, comprising:
a substrate;
a lower electrode layer disposed on the substrate;
a switching layer disposed on the lower electrode layer, configured for performing a switching operation by forming and destroying a conductive filament, and made of a multi-layer to control the formation of the conductive filament; and
an upper electrode layer disposed on the switching layer, wherein the switching layer comprises:
a first metal doped layer, a first conductive filament forming layer, a threshold voltage control layer, a second conductive filament forming layer and a second metal doped layer, respectively disposed on the lower electrode layer.

7. The multi-layer selector device of claim 6, wherein in the switching layer,
the first metal doped layer is disposed on the lower electrode layer;
the first conductive filament forming layer is disposed on the first metal doped layer;
the threshold voltage control layer is disposed on the first conductive filament forming layer;
the second conductive filament forming layer is disposed on the threshold voltage control layer; and
the second metal doped layer is disposed on the second conductive filament forming layer.

8. The multi-layer selector device of claim 6, wherein in the switching layer,
the first conductive filament forming layer is disposed on the lower electrode layer;
the first metal doped layer is disposed on the first conductive filament forming layer;
the threshold voltage control layer is disposed on the first metal doped layer;
the second metal doped layer is disposed on the threshold voltage control layer; and
the second conductive filament forming layer is disposed on the second metal doped layer.

9. The multi-layer selector device of claim 6, wherein the threshold voltage control layer comprises at least one of silicon oxide, silicon nitride, silicon oxynitride, hafnium oxide, titanium oxide, tantalum oxide, aluminum oxide, and zirconium oxide.

10. A multi-layer selector device, comprising:
a substrate;
a lower electrode layer disposed on the substrate;
a switching layer disposed on the lower electrode layer, configured for performing a switching operation by forming and destroying a conductive filament, and made of a multi-layer to control the formation of the conductive filament; and
an upper electrode layer disposed on the switching layer, wherein the multi-layer in the switching layer has a gradient of doping concentration of a metal forming the conductive filament.

11. The multi-layer selector device of claim 10, wherein the switching layer comprises:

a first metal doped layer disposed on the lower electrode layer and doped with the metal forming the conductive filament;
a conductive filament forming layer disposed on the first metal doped layer, in which the conductive filament is formed or destroyed by the metal; and
a second metal doped layer disposed on the conductive filament forming layer and doped with the metal forming the conductive filament.

12. The multi-layer selector device of claim 11, wherein the first metal doped layer and the second metal doped layer have a first metal doping concentration, and
wherein the conductive filament forming layer has a second metal doping concentration lower than the first metal doping concentration.

13. The multi-layer selector device of claim 11, wherein the first metal doped layer and the second metal doped layer have a first metal doping concentration, and
wherein the conductive filament forming layer is undoped with the metal.

14. The multi-layer selector device of claim 11, wherein the conductive filament forming layer has a first metal doping concentration, and
wherein the first metal doped layer and the second metal doped layer have a second metal doping concentration lower than the first metal doping concentration.

15. A method of fabricating a multi-layer selector device, comprising:
providing a substrate;
forming a lower electrode layer on the substrate;
forming an insulating layer on the lower electrode layer;
removing a portion of the insulating layer to form a via hole exposing the lower electrode layer;
forming a switching layer made of multi-layer in the via hole to control a formation of a conductive filament; and
forming an upper electrode layer on the switching layer.

16. The method of fabricating the multi-layer selector device of claim 15, wherein the switching layer is made of the multi-layer having a gradient in doping concentration of a metal in the via hole, and
wherein forming the switching layer is performed to have a gradient of doping concentration of the metal using co-sputtering using an oxide target and a metal target together.

17. The method of fabricating the multi-layer selector device of claim 15, wherein forming the switching layer comprises:
forming a threshold voltage control layer comprising an insulating layer and controlling the formation of the conductive filament;
forming a conductive filament forming layer in which the conductive filament is formed, on the threshold voltage control layer; and
forming a metal doped layer for providing a metal to the conductive filament, on the conductive filament forming layer.

18. The method of fabricating the multi-layer selector device of claim 15, wherein forming the switching layer comprises:
forming a metal doped layer for providing a metal to the conductive filament;
forming a conductive filament forming layer in which the conductive filament is formed, on the metal doped layer; and forming a threshold voltage control layer comprising an insulating layer and controlling the formation of the conductive filament.

19. The method of fabricating the multi-layer selector device of claim 15, after forming the upper electrode layer, further comprising:
   annealing the multi-layer selector device at a temperature of 100° C. to 500° C.

* * * * *